(12) United States Patent
Betts et al.

(10) Patent No.: US 10,951,159 B2
(45) Date of Patent: Mar. 16, 2021

(54) SOLAR TRACKER CONTROL SYSTEM AND METHOD

(71) Applicant: SUNFOLDING, INC., San Francisco, CA (US)

(72) Inventors: Kyle Douglass Betts, San Francisco, CA (US); Joshua Earle Erickson, Oakland, CA (US); Dan Goldwater, Amherst, MA (US); Jeffrey Charles Lamb, San Francisco, CA (US); Leila Madrone, San Francisco, CA (US); James Vincent Nolan, IV, San Francisco, CA (US); Vincent Domenic Romanin, San Francisco, CA (US); Matthew N Schneider, Sierra Madre, CA (US); Eric Preston Lien Suan, Baltimore, MD (US)

(73) Assignee: SUNFOLDING, INC., San Francisco, CA (US)

( * ) Notice: Subject to any disclaimer, the term of this patent is extended or adjusted under 35 U.S.C. 154(b) by 0 days.

(21) Appl. No.: 15/955,519

(22) Filed: Apr. 17, 2018

(65) Prior Publication Data

US 2018/0302027 A1 Oct. 18, 2018

Related U.S. Application Data

(60) Provisional application No. 62/486,335, filed on Apr. 17, 2017, provisional application No. 62/486,369, (Continued)

(51) Int. Cl.
*H02S 20/32* (2014.01)
*F24S 50/20* (2018.01)
(Continued)

(52) U.S. Cl.
CPC ............... *H02S 20/32* (2014.12); *B25J 9/142* (2013.01); *F15B 15/10* (2013.01); *F24S 30/425* (2018.05);
(Continued)

(58) Field of Classification Search
CPC ....................................................... H02S 20/32
See application file for complete search history.

(56) References Cited

U.S. PATENT DOCUMENTS 979,460 A 12/1910 Fulton
2,920,656 A 1/1960 Bertolet
(Continued)

FOREIGN PATENT DOCUMENTS

CA 2330612 A1 6/2002
CN 101783619 A 7/2010
(Continued)

OTHER PUBLICATIONS

U.S. Appl. No. 14/064,071, filed Oct. 25, 2013
(Continued)

*Primary Examiner* — Edward J. Schmiedel
(74) *Attorney, Agent, or Firm* — Davis Wright Tremaine LLP

(57) ABSTRACT

A pneumatic control unit configured to inflate a first and second set of bellows with fluid from a pneumatic fluid source via a pneumatic circuit, the first and second set of bellows associated with one or more pneumatic actuators. The pneumatic control unit determines a target configuration of the actuators based on a determined current position of the sun; determines a current configuration of the actuators; determines a difference between the determined current configuration and target configuration of the actuators; determines that the difference between current configuration and the target configuration of the actuators is outside of a
(Continued)

tolerance range; and actuates the actuators toward the determined target configuration by at least one of inflating the first or second set of bellows with fluid from the pneumatic fluid source via the pneumatic circuit.

20 Claims, 14 Drawing Sheets

Related U.S. Application Data filed on Apr. 17, 2017, provisional application No. 62/486,377, filed on Apr. 17, 2017.

(51) Int. Cl.
| | | |
|---|---|---|
| *H01L 31/042* | (2014.01) | |
| *F24S 30/425* | (2018.01) | |
| *H02S 20/10* | (2014.01) | |
| *F15B 15/10* | (2006.01) | |
| *B25J 9/14* | (2006.01) | |
| *F24S 30/00* | (2018.01) | |
| *G01S 3/786* | (2006.01) | |

(52) U.S. Cl.
CPC ............ *F24S 50/20* (2018.05); *H01L 31/042* (2013.01); *H02S 20/10* (2014.12); *F15B 2211/6303* (2013.01); *F15B 2211/6309* (2013.01); *F15B 2211/7107* (2013.01); *F15B 2211/7656* (2013.01); *F15B 2211/8855* (2013.01); *F24S 2030/115* (2018.05); *F24S 2030/12* (2018.05); *G01S 3/7861* (2013.01); *Y02E 10/47* (2013.01); *Y02E 10/50* (2013.01)

(56) References Cited

U.S. PATENT DOCUMENTS

| | | | |
|---|---|---|---|
| 3,284,964 A | 11/1966 | Norio | |
| 3,472,062 A | 10/1969 | Owen | |
| 3,602,047 A | 8/1971 | Kistler | |
| 3,800,398 A | 4/1974 | Harrington, Jr. | |
| 3,956,543 A | 5/1976 | Stangeland | |
| 3,982,526 A | 9/1976 | Barak | |
| 4,063,543 A | 12/1977 | Hedger | |
| 4,102,326 A | 7/1978 | Sommer | |
| 4,120,635 A | 10/1978 | Langecker | |
| 4,154,221 A | 5/1979 | Nelson | |
| 4,172,443 A | 10/1979 | Sommer | |
| 4,175,540 A | 11/1979 | Roantree et al. | |
| 4,185,615 A | 1/1980 | Bottum | |
| 4,198,954 A | 4/1980 | Meijer | |
| 4,345,582 A | 8/1982 | Aharon | |
| 4,424,802 A | 1/1984 | Winders | |
| 4,459,972 A | 7/1984 | Moore | |
| 4,464,980 A | 8/1984 | Yoshida | |
| 4,494,417 A | 1/1985 | Larson et al. | |
| 4,566,432 A | 1/1986 | Sobczak et al. | |
| 4,620,771 A | 11/1986 | Dominguez | |
| 4,751,868 A | 6/1988 | Paynter | |
| 4,768,871 A | 9/1988 | Mittelhauser et al. | |
| 4,777,868 A | 10/1988 | Larsson | |
| 4,784,042 A | 11/1988 | Paynter | |
| 4,832,001 A | 5/1989 | Baer | |
| 4,848,179 A | 7/1989 | Ubhayakar | |
| 4,900,218 A | 2/1990 | Sutherland | |
| 4,939,982 A | 7/1990 | Immega et al. | |
| 4,954,952 A | 9/1990 | Ubhayakar et al. | |
| 4,977,790 A | 12/1990 | Nishi et al. | |
| 5,021,798 A | 6/1991 | Ubhayakar | |
| 5,040,452 A | 8/1991 | Van Kerkvoort | |
| 5,080,000 A | 1/1992 | Bubic et al. | |
| 5,156,081 A | 10/1992 | Suzumori | |
| 5,181,452 A | 1/1993 | Immega | |
| 5,251,538 A | 10/1993 | Smith | |
| 5,317,952 A | 6/1994 | Immega | |
| 5,337,732 A | 8/1994 | Grundfest et al. | |
| 5,386,741 A | 2/1995 | Rennex | |
| 5,469,756 A | 11/1995 | Feiten | |
| 5,697,285 A | 12/1997 | Nappi et al. | |
| 5,816,769 A | 10/1998 | Bauer et al. | |
| 6,054,529 A | 4/2000 | O'Donnell et al. | |
| 6,080,927 A * | 6/2000 | Johnson | F24S 20/20 136/248 |
| 6,178,872 B1 | 1/2001 | Schulz | |
| 6,557,804 B1 | 5/2003 | Carroll | |
| 6,772,673 B2 | 8/2004 | Seto et al. | |
| 6,875,170 B2 | 4/2005 | Francois et al. | |
| 7,331,273 B2 | 2/2008 | Kerekes et al. | |
| 7,531,741 B1 * | 5/2009 | Melton | H02S 20/32 136/246 |
| 7,614,615 B2 | 11/2009 | Egolf | |
| 8,201,473 B2 | 6/2012 | Knoll | |
| 8,305,736 B2 | 11/2012 | Yee et al. | |
| 8,657,271 B2 | 2/2014 | Szekely et al. | |
| 8,700,215 B2 | 4/2014 | Komatsu et al. | |
| 8,863,608 B2 | 10/2014 | Fischer et al. | |
| 8,899,359 B1 | 12/2014 | Hafenrichter et al. | |
| 9,133,864 B2 | 9/2015 | Menon et al. | |
| 9,624,911 B1 | 4/2017 | Griffith et al. | |
| 9,919,434 B1 | 3/2018 | Rey et al. | |
| 10,135,388 B2 | 11/2018 | Madrone et al. | |
| 10,384,354 B2 | 8/2019 | Griffith et al. | |
| 10,562,180 B2 | 2/2020 | Telleria et al. | |
| 2005/0034752 A1 | 2/2005 | Gross et al. | |
| 2006/0049195 A1 | 3/2006 | Koussios et al. | |
| 2009/0097994 A1 | 4/2009 | Beck et al. | |
| 2009/0115292 A1 | 5/2009 | Ueda et al. | |
| 2009/0151775 A1 | 6/2009 | Pietrzak | |
| 2009/0314119 A1 | 12/2009 | Knoll | |
| 2010/0043776 A1 | 2/2010 | Gee | |
| 2010/0125401 A1 | 5/2010 | Hamama et al. | |
| 2011/0073161 A1 * | 3/2011 | Scanlon | H02S 20/32 136/246 |
| 2011/0114080 A1 * | 5/2011 | Childers | F03G 7/06 126/601 |
| 2012/0210818 A1 | 8/2012 | Fischer et al. | |
| 2012/0285509 A1 | 11/2012 | Surganov | |
| 2013/0247962 A1 | 9/2013 | Sakai et al. | |
| 2015/0244309 A1 | 8/2015 | Sakai et al. | |
| 2017/0184327 A1 | 6/2017 | Griffith et al. | |
| 2017/0282360 A1 | 10/2017 | Telleria et al. | |

FOREIGN PATENT DOCUMENTS

| | | |
|---|---|---|
| CN | 103222067 A | 7/2013 |
| CN | 103786165 A | 5/2014 |
| EP | 2648226 A1 | 10/2013 |
| FR | 2603228 A1 | 3/1988 |
| JP | 2014116360 A | 6/2014 |
| KR | 101034478 B1 | 5/2011 |
| KR | 20130019502 A | 2/2013 |
| RU | 2516595 C2 | 5/2014 |
| RU | 2611571 C1 | 2/2017 |
| SU | 1346918 A1 | 10/1987 |
| WO | 2001017731 A1 | 3/2001 |
| WO | 2011094084 A2 | 8/2011 |
| WO | 12015378 A1 | 2/2012 |
| WO | 2016123592 A1 | 8/2016 |

OTHER PUBLICATIONS

U.S. Appl. No. 15/793,591, filed Oct. 25, 2017
U.S. Appl. No. 14/064,072, filed Oct. 25, 2013
U.S. Appl. No. 15/472,740, filed Mar. 29, 2017
U.S. Appl. No. 13/557,521, filed Jul. 25, 2012
U.S. Appl. No. 15/012,715, filed Feb. 1, 2016
U.S. Appl. No. 16/134,844, filed Sep. 18, 2018
U.S. Appl. No. 14/064,070, filed Oct. 25, 2013
U.S. Appl. No. 15/456,347, filed Mar. 10, 2017
U.S. Appl. No. 15/955,044, filed Apr. 17, 2018
U.S. Appl. No. 15/955,506, filed Apr. 17, 2018

(56) References Cited

OTHER PUBLICATIONS

U.S. Appl. No. 16/423,899, filed May 28, 2019.
International Search Report and Written Opinion dated Aug. 29, 2019, Patent Application No. PCT/US2019/034202, filed May 28, 2019, 7 pages.
Author Unkown, http://www.utilityscalesolar.com/Utility_Scale_Solar,_Inc/USS_Homepage.html, Utility Scale Solar, Inc., 2011.
International Search Report and Written Opinion dated Aug. 14, 2017, International Patent Application No. PCT/US2017/024730, filed Mar. 29, 2017.
International Search Report and Written Opinion dated Aug. 2, 2018, International Patent Application No. PCT/US2018/028020, filed Apr. 17, 2018, 7 pages.
International Search Report and Written Opinion dated Aug. 2, 2018, International Patent Application No. PCT/US2018/028024, filed Apr. 17, 2018, 7 pages.
International Search Report and Written Opinion dated Aug. 9, 2018, International Patent Application No. PCT/US2018/028025, filed Apr. 17, 2018, 7 pages.
International Search Report and Written Opinion dated May 5, 2016, International Patent Application No. PCT/US2016/015857, filed Jan. 30, 2016.
SEBA, "Solar Trillions," pp. 246-250, Jan. 28, 2010.
The Wiley Encyclopedia of Packaging Technology 3rd Ed., Wiley Publications, p. 145, Sep. 2009.

\* cited by examiner

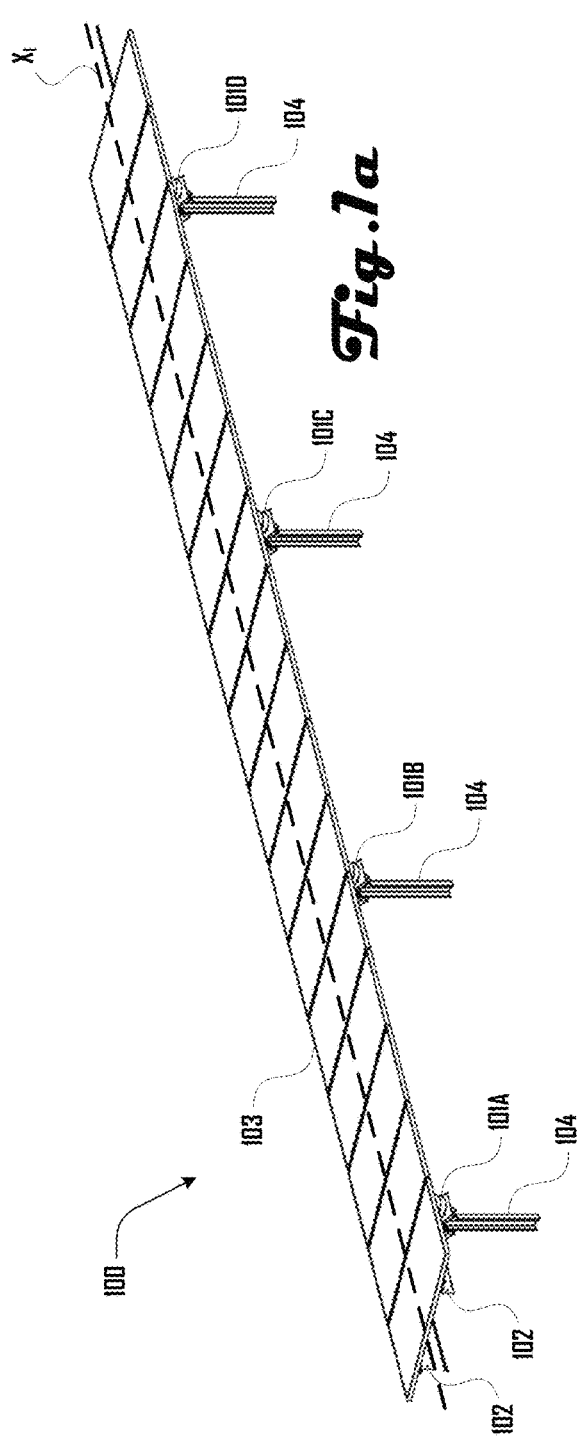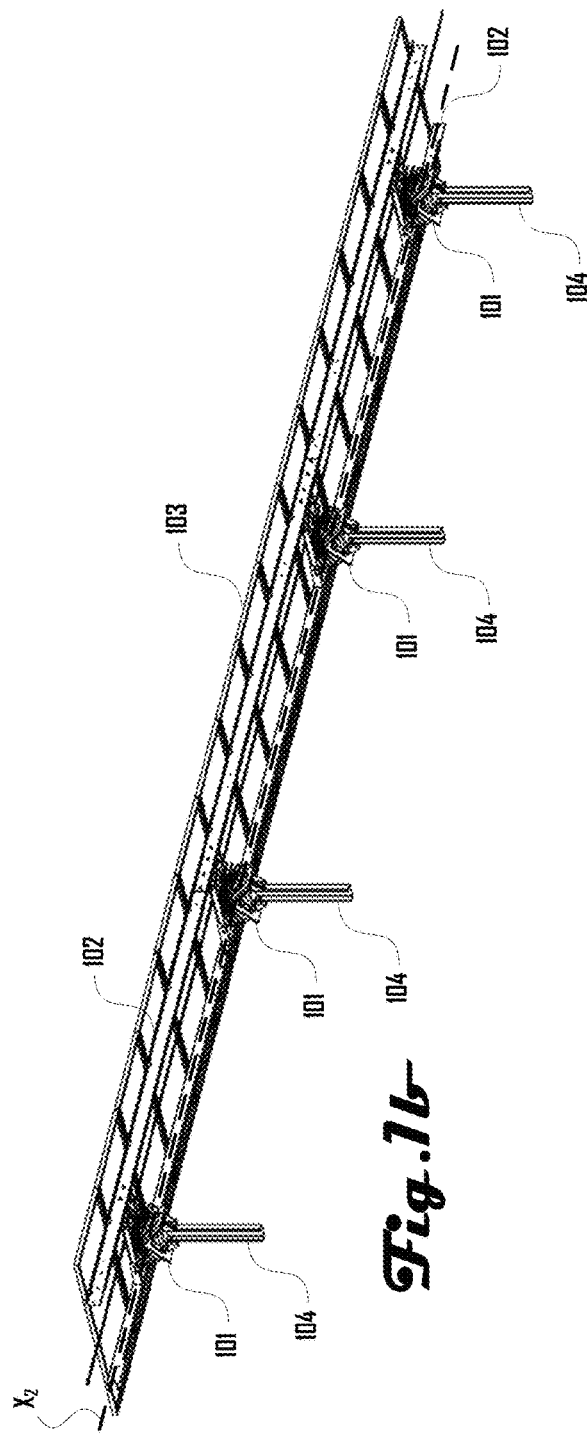

SOLAR TRACKER CONTROL SYSTEM AND METHOD

CROSS-REFERENCE TO RELATED APPLICATIONS

This application is a non-provisional of and claims priority to U.S. Provisional Applications entitled "PNEUMATIC ACTUATOR SYSTEM AND METHOD" and "PNEUMATIC ACTUATION CIRCUIT SYSTEM AND METHOD" and "SOLAR TRACKER CONTROL SYSTEM AND METHOD" respectively having application Nos. 62/486,335, 62/486,377 and 62/486,369. These applications are hereby incorporated herein by reference in their entirety and for all purposes.

This application is related to U.S. Non-Provisional Applications filed contemporaneously herewith entitled "PNEUMATIC ACTUATOR SYSTEM AND METHOD" and "PNEUMATIC ACTUATION CIRCUIT SYSTEM AND METHOD" respectively, and having Ser. Nos. 15/955,044 and 15/955,506. These applications are hereby incorporated herein by reference in their entirety and for all purposes.

This application is also related to U.S. application Ser. No. 15/012,715, filed Feb. 1, 2016, which claims the benefit of U.S. provisional patent application 62/110,275 filed Jan. 30, 2015. These applications are hereby incorporated herein by reference in their entirety and for all purposes.

This application is also related to U.S. application Ser. Nos. 14/064,070 and 14/064,072, both filed Oct. 25, 2013, which claim the benefit of U.S. Provisional Application Nos. 61/719,313 and 61/719,314, both filed Oct. 26, 2012. All of these applications are hereby incorporated herein by reference in their entirety and for all purposes.

STATEMENT REGARDING FEDERALLY-SPONSORED RESEARCH

This invention was made with Government support under contract number DE-AR0000330 awarded by DOE, Office of ARPA-E. The Government has certain rights in this invention.

BRIEF DESCRIPTION OF THE DRAWINGS

FIGS. 1a and 1b illustrate a respective top perspective and bottom perspective view of a solar tracker in accordance with various embodiments.

Figure 2:
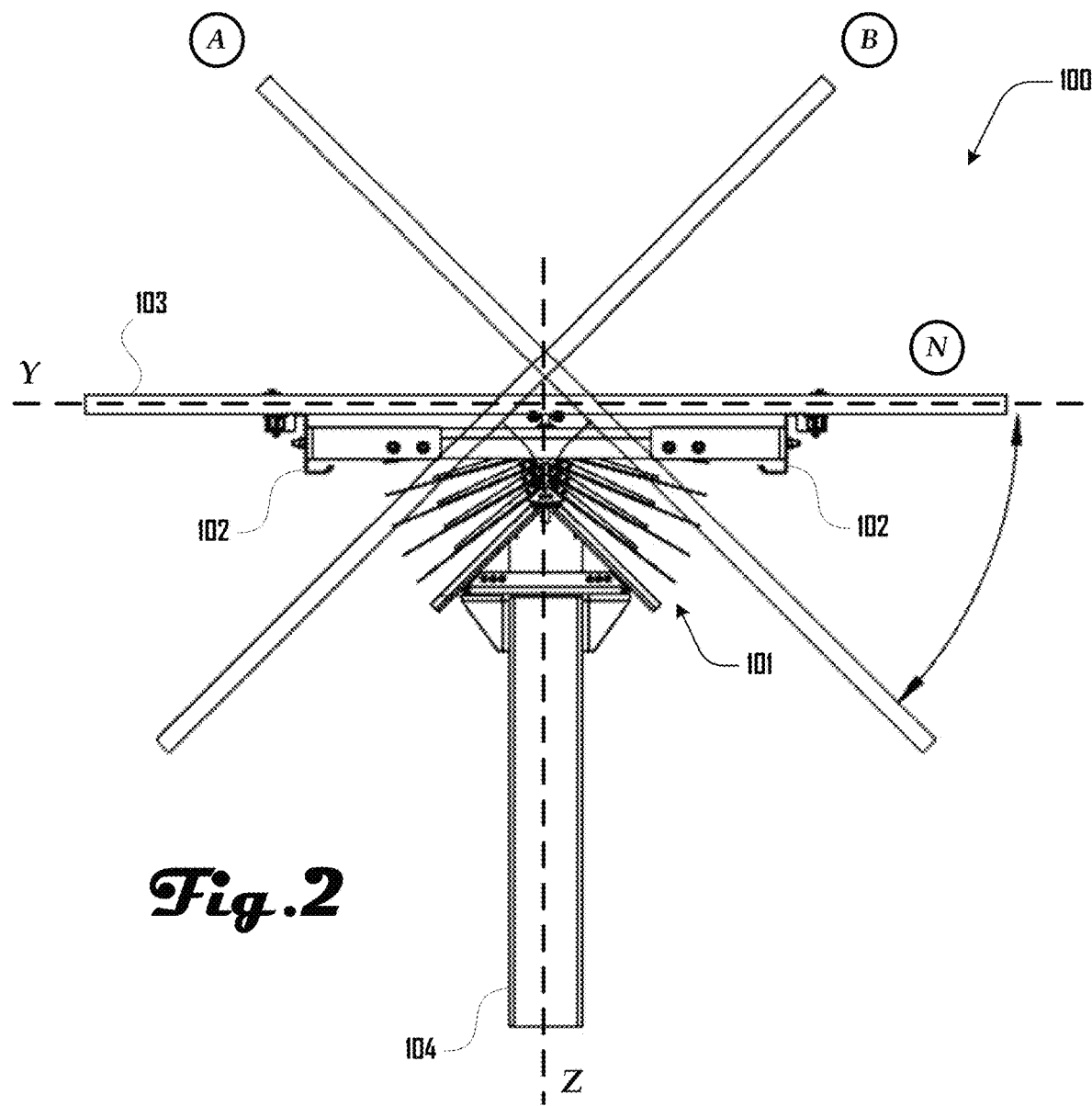
FIG. 2 illustrates a side view of a solar tracker.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION OF THE PREFERRED EMBODIMENTS

FIGS. 1a and 1b illustrate respective top perspective and bottom perspective views of a solar tracker 100 in accordance with various embodiments. FIG. 2 illustrates a side view of the solar tracker 100. As shown in FIGS. 1a, 1b and 2, the solar tracker 100 can comprise a plurality of photovoltaic cells 103 disposed along a length having axis $X_1$ and a plurality of pneumatic actuators 101 configured to collectively move the array of photovoltaic cells 103. As shown in FIG. 1b, the photovoltaic cells 103 are coupled to rails 102 that extend along parallel axes $X_2$, which are parallel to axis $X_1$. Each of the plurality of actuators 101 extend between and are coupled to the rails 102, with the actuators 101 being coupled to respective posts 104. As shown in FIG. 2, the posts 104 can extend along an axis Z, which can be perpendicular to axes $X_1$ and $X_2$ in various embodiments.

As shown in FIG. 2, and discussed in more detail herein, the actuators 101 can be configured to collectively tilt the array of photovoltaic cells 103 based on an angle or position of the sun, which can be desirable for maximizing light exposure to the photovoltaic cells 103 and thereby maximizing electrical output of the photovoltaic cells 103. In various embodiments, the actuators 101 can be configured to move the photovoltaic cells 103 between a plurality of configurations as shown in FIG. 2, including a neutral configuration N where the photovoltaic cells 103 are disposed along axis Y that is perpendicular to axis Z. From the neutral configuration N, the actuators 101 can be configured to move the photovoltaic cells 103 to a first maximum tilt position A, to a second maximum tilt position B, or any position therebetween. In various embodiments, the angle between the neutral configuration N and the maximum tilt positions A, B can be any suitable angle, and in some embodiments, can be the same angle. Such movement can be used to position the photovoltaic cells 103 toward the sun, relative to an angle of the sun, to reflect light toward a desired position, or the like.

In one preferred embodiment as shown in FIGS. 1a and 1b, a solar tracker 100 can comprise a plurality of photovoltaic cells 103 that are collectively actuated by four actuators 101 disposed along a common axis. However, in further embodiments, a solar tracker 100 can comprise any suitable number of actuators 101 including one, two, three, four, five, six, seven, eight, nine, ten, fifteen, twenty, fifty, one hundred, or the like. Similarly, any suitable number of photovoltaic cells 103 can be associated with a solar tracker 100 in further embodiments. Additionally, while photovoltaic cells 103 are shown in example embodiments herein, in further embodiments, actuators 101 can be used to move various other objects or structures, including mirrors, reflectors, imaging devices, communications devices, and the like.

Figure 3:
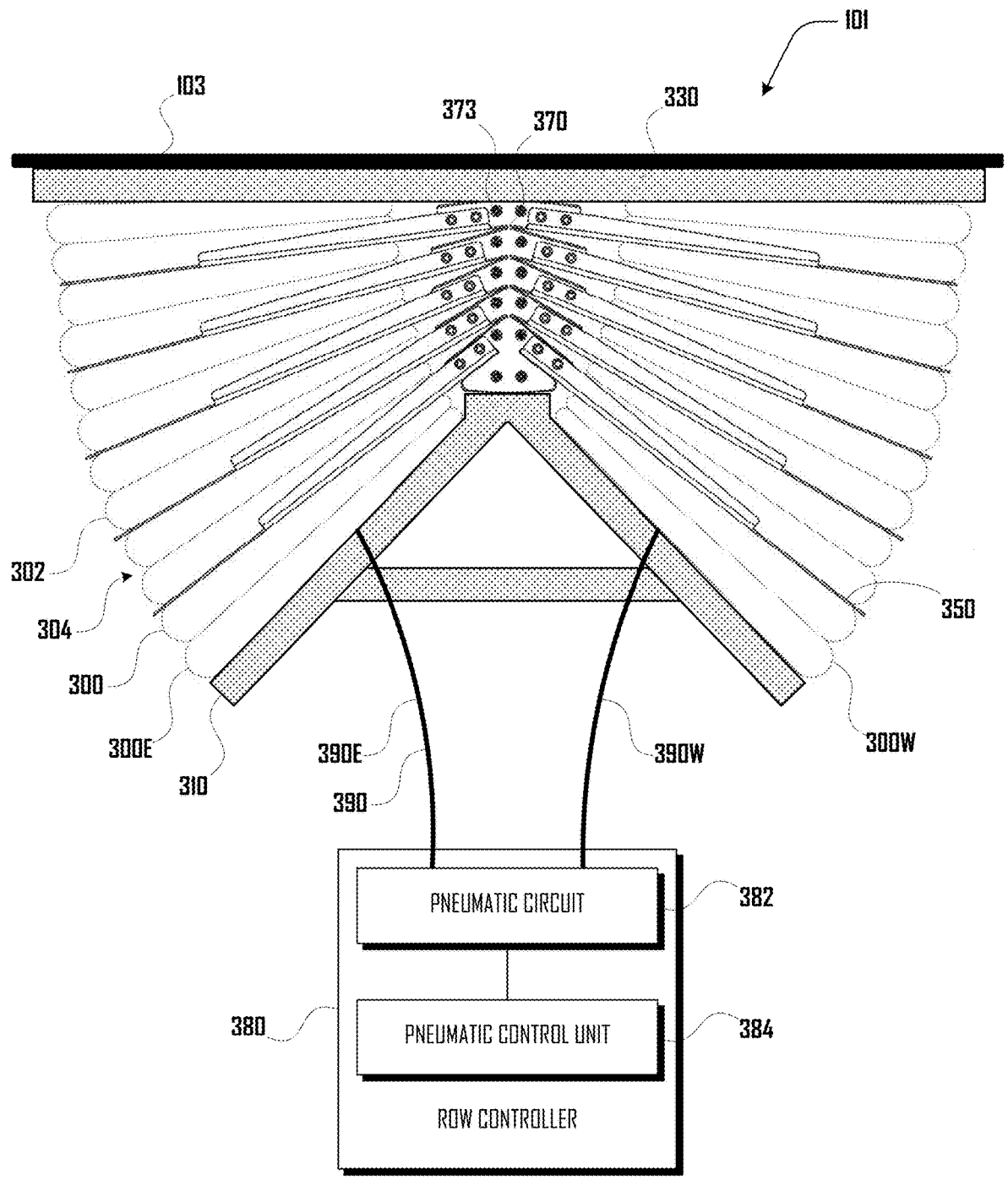
FIG. 3 illustrates a side view of an actuator in accordance with one embodiment, which comprises a V-shaped bottom plate, a planar top-plate, and a set of bellows that are disposed between the top and bottom plates and surrounded by a set of washers.

FIG. 3 illustrates a side view of an actuator 101 in accordance with one embodiment. As shown in the example of FIG. 3, the actuator 101 comprises a V-shaped bottom plate 310, a planar top-plate 330, and a set of bellows 300 that are disposed between the top and bottom plates 330, 310 and surrounded by a set of washers 350. The washers 350 are coupled to a hub assembly 370 that extends between the bottom and top plates 310, 330, with the hub assembly 370 defined by a plurality of stacked hub units 373.

The example embodiment of FIG. 3 illustrates the actuator 101 in a neutral configuration N (see FIG. 2), where the top plate 330 extends along axis Y, which is perpendicular to axis Z in the neutral configuration N. However, as discussed herein, the top plate 330 can be configured to tilt to the left and right (or east and west as discussed herein) based on selective inflation and/or deflation of the bellows 300. Components of an actuator 101 can comprise various suitable materials, including metal (e.g., steel, aluminum, iron, titanium, or the like), plastic or the like. In various embodiments, metal parts can be coated for corrosion prevention (e.g., hot dip galvanized, pre galvanized, or the like).

A row controller 380 can be operably coupled with bellows 300 of the actuator via pneumatic lines 390. More specifically, an east bellows 300E can be coupled to a pneumatic circuit 382 of the row controller 380 via an east pneumatic line 390E. A west bellows 300W can be coupled to the pneumatic circuit 382 of the row controller 380 via a west pneumatic line 390W. A pneumatic control unit 384 can be operably coupled to the pneumatic circuit 382, which can control the pneumatic circuit 382 to selectively inflate and/or deflate the bellows 300 to move the top plate 330 of the actuator 101 to tilt photovoltaic cells 103 coupled to the top plate 330.

For example, as described herein, bellows 300 of an actuator 101 can be inflated and/or deflated which can cause the bellows 300 to expand and/or contract along a length of the bellows 300 and cause movement of washers 350 surrounding the bellows 300. Such movement of the washers 350 can in turn cause rotation, movement or pivoting of the hub units 373 of the hub assembly 370. Such pivoting of hub units 373 of the hub assembly 370 can be generated when a solar tracker 100 is moving between a neutral position N and the maximum tilt positions A, B as shown in FIG. 2.

As shown in FIG. 3, a bellows 300 can comprise a convoluted body defined by repeating alternating valleys 302 and peaks 304 extending between a first and second end of the bellows 300. In various embodiments, a bellows 300 can be generally cylindrical about a central axis along which the bellows 300 extend. In various embodiments, the bellows 300 and portions thereof can have one or more axes of symmetry about a central axis. For example, in various embodiments, the convolutions of the bellows 300 can have circular radial symmetry and/or axial symmetry about a central axis between the first and second ends or at least a portion thereof. However, as shown in FIG. 3, the bellows 300 can be held within an actuator 101 in a curved configuration such that the portion of the bellows 300 proximate to the hub assembly 370 is compressed compared to the portion of the bellows that is distal from the hub assembly 370.

In various embodiments, the bellows 300 can be configured to expand along the length of the bellows 300 when fluid is introduced into the hollow bellows 300 or when the bellows 300 are otherwise inflated. Accordingly, the bellows 300 can be configured to contract along the length of the bellows 300 when fluid is removed from the hollow bellows 300 or when the bellows 300 are otherwise deflated.

Where bellows 300 are configured to expand lengthwise based on increased pressure, fluid or inflation and configured to contract lengthwise based on decreased pressure, fluid or inflation, movement of the photovoltaic cells 103 via one or more actuators 101 can be achieved in various ways. For example, referring to the example of FIG. 3, rotating the photovoltaic cells 103 west (i.e., to the right in this example) can be achieved via one or more of the following:

TABLE 1

Examples of Actions to Rotate Actuator 101 West

| East Bellows 300E | West Bellows 300W | Result |
|---|---|---|
| Increase Pressure | Maintain Pressure | Rotate West |
| Increase Pressure | Reduce Pressure | Rotate West |
| Maintain Pressure | Reduce Pressure | Rotate West |
| Decrease Pressure | Decrease Pressure More Than East Bellows 300E | Rotate West |
| Increase Pressure | Increase Pressure Less Than East Bellows 300E | Rotate West |

Referring again to the example of FIG. 3, rotating the photovoltaic cells 103 east (i.e., to the left in this example) can be achieved via one or more of the following:

TABLE 2

Examples of Actions to Rotate Actuator 101 East

| East Bellows 300E | West Bellows 300W | Result |
|---|---|---|
| Maintain Pressure | Increase Pressure | Rotate East |
| Reduce Pressure | Increase Pressure | Rotate East |
| Reduce Pressure | Maintain Pressure | Rotate East |
| Decrease Pressure More Than West Bellows 300W | Decrease Pressure | Rotate East |
| Increase Pressure Less Than West Bellows 300W | Increase Pressure | Rotate East |

Accordingly, in various embodiments, by selectively increasing and/or decreasing the amount of fluid within bellows 300E, 300W, the top plate 330 and photovoltaic cells 103 can be actuated to track the location or angle of the sun.

While various embodiments of an actuator 101 can include two bellows 300E, 300W, further embodiments can comprise a single bellows 300 or any suitable plurality of bellows 300. In various embodiments, actuators 101 include orifices which equalize the flow among many actuators 101, and/or limit the rate of motion as discussed herein.

Figure 4:
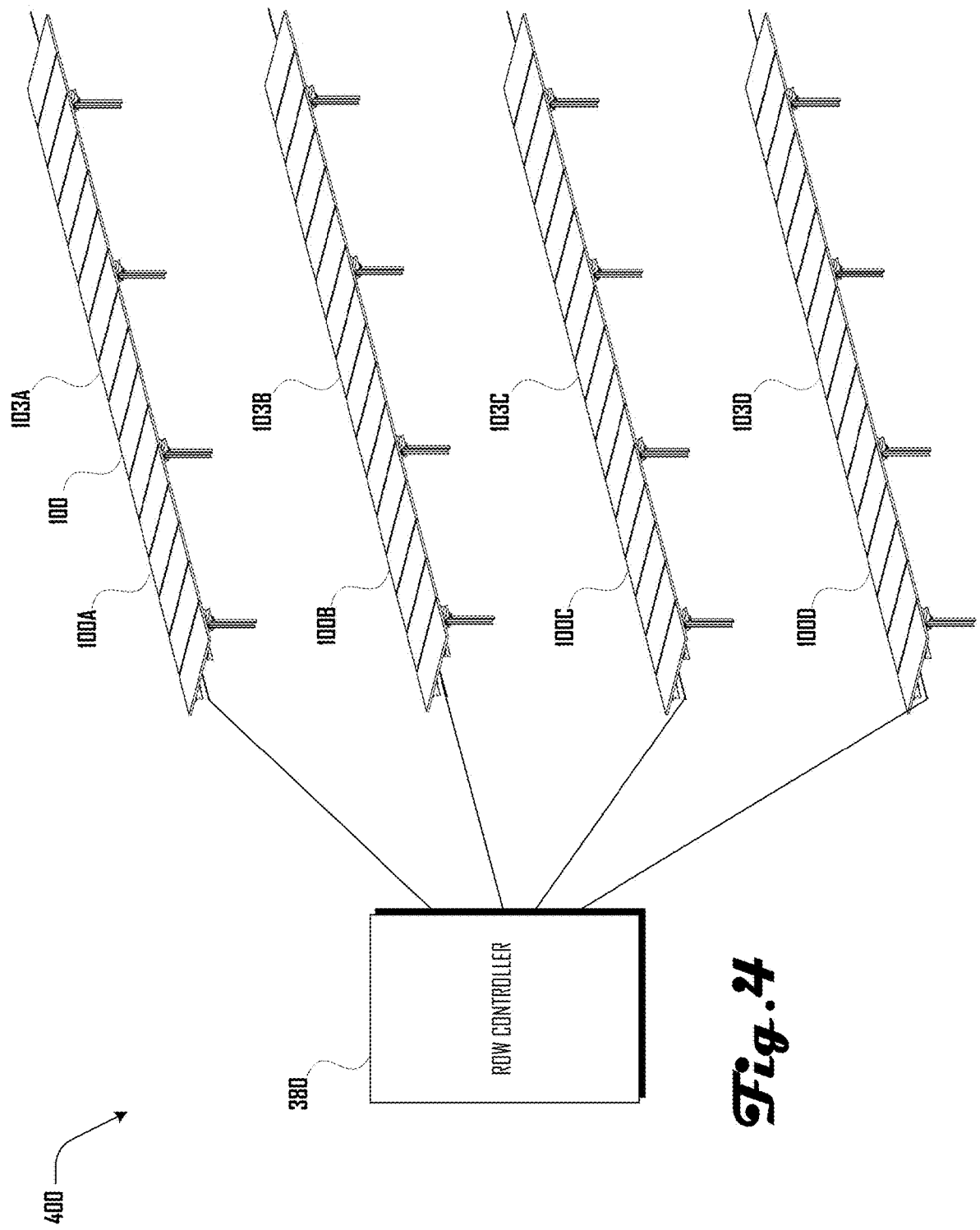
FIG. 4 illustrates an example of a solar tracking system that includes a row controller that controls a plurality of rows of solar trackers.

Turning to FIG. 4, in various embodiments, a plurality of solar trackers 100 can be actuated by a row controller 380 in a solar tracking system 400. In this example, four solar trackers 100A, 100B, 100C, 100D can be controlled by a single row controller 380, which is shown being operably coupled thereto. As described in more detail herein, in some examples, a plurality of trackers 100 or a subset of trackers 100 can be controlled in unison. However, in further embodiments, one or more trackers 100 of a plurality of trackers 100 can be controlled differently than one or more other trackers 100.

While various examples shown and described herein illustrate a solar tracking system 400 having various pluralities of rows of trackers 100, these should not be construed to be limiting on the wide variety of configurations of photovoltaic panels 103 and pneumatic actuators 101 that are within the scope and spirit of the present disclosure. For example, some embodiments can include a single row or any suitable plurality of rows, including one, two, three, four, five, six, seven, eight, nine, ten, eleven, twelve, fifteen, twenty, twenty five, fifty, one hundred, and the like.

Additionally, a given row can include any suitable number of actuators 101 and photovoltaic panels 103, including one, two, three, four, five, six, seven, eight, nine, ten, eleven, twelve, fifteen, twenty, twenty five, fifty, one hundred, two hundred, five hundred, and the like. Rows can be defined by a plurality of physically discrete tracker units. For example, a tracker unit 100 can comprise one or more actuators 101 coupled to one or more photovoltaic panels 103.

In some preferred embodiments, the axis of a plurality of solar trackers 100 can extend in parallel in a north-south orientation, with the actuators 101 of the rows configured to rotate the photovoltaic panels about an east-west axis. However, in further embodiments, the axis of trackers 100 can be disposed in any suitable arrangement and in any suitable orientation. For example, in further embodiments, some or all rows may not be parallel or extend north-south. Additionally, in further embodiments, rows can be non-linear, including being disposed in an arc, circle, or the like. Accordingly, the specific examples herein (e.g., indicating "east" and "west") should not be construed to be limiting.

Also the rows of trackers 100 can be coupled to the ground, over water, or the like, in various suitable ways including via a plurality of posts. Additionally, while various embodiments described herein describe a solar tracking system 400 configured to track a position of the sun or move to a position that provides maximum light exposure, further examples can be configured to reflect light to a desired location (e.g., a solar collector), and the like.

Figure 5:
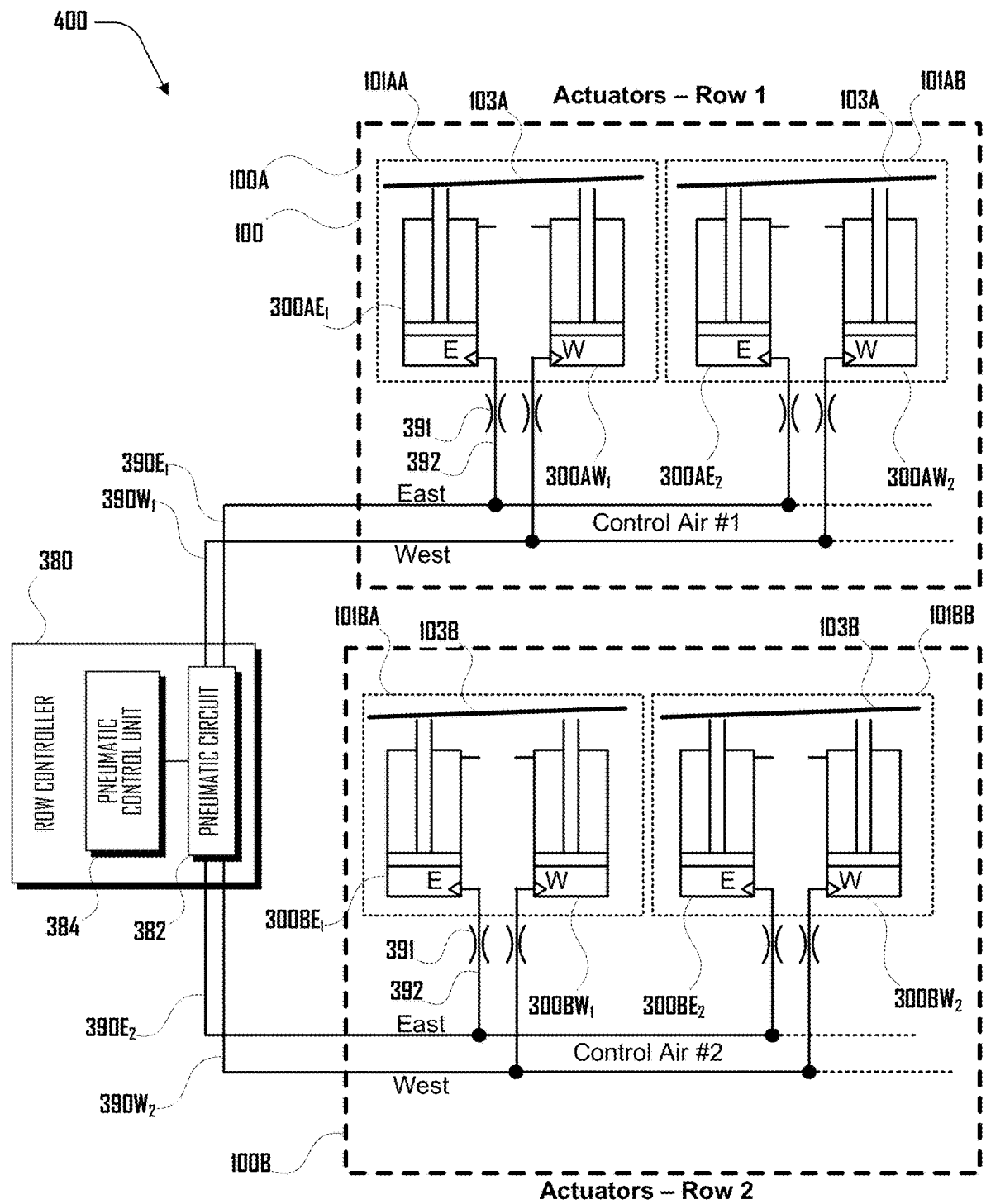
FIG. 5 is an exemplary illustration of a set of rows, including a first tracker and second tracker, with each tracker comprising a plurality of actuators disposed along a common axis and with each actuator comprising a first and second bellows.

FIG. 5 is an exemplary illustration of a set of rows, including a first tracker 100A and second tracker 100B, with each tracker 100 comprising a plurality of actuators 101 disposed along a common axis (e.g., as shown in FIGS. 1a, 1b and 4) with each actuator 101 comprising a first and second bellows 300. More specifically, FIG. 5 illustrates a first solar tracker 100A that comprises a first actuator 101AA and a second actuator 101AB on which a first set of photovoltaic cells 103A are disposed. The first actuator 101AA of the first tracker 100A comprises east and west bellows $300AE_1$, $300AW_1$ and the second actuator 100B of the first tracker 100AB comprises east and west bellows $300AE_2$, $300AW_2$.

A second solar tracker 100B comprises a first actuator 101BA and a second actuator 101BB on which a second set of photovoltaic cells 103B are disposed. The first actuator 101BA of the second tracker 100B comprises east and west bellows $300BE_1$, $300BW_1$ and the second actuator 100BB of the second tracker 100B comprises east and west bellows $300BE_2$, $300BW_2$.

A row controller 380 is shown comprising a pneumatic control unit 384 that is operably connected to a pneumatic circuit 382 that drives the bellows 300 of the first and second trackers 101A, 101B via respective pneumatic lines 390 that are configured to introduce and/or remove fluid from the bellows 300 (e.g., via respective bellows branches 392 that extend from the pneumatic lines 390). More specifically, a first east pneumatic line $390E_1$ is shown being operably connected to the first and second east bellows $300AE_1$, $300AE_2$ of the first tracker 100A. Accordingly, because the first and second east bellows $300AE_1$, $300AE_2$ of the first tracker 100A share a common pneumatic line $390E_1$, pneumatic circuit 382 can drive, introduce fluid to, remove fluid from, and/or otherwise control the first and second east bellows $300AE_1$, $300AE_2$ in unison via the common pneumatic line $390E_1$.

Similarly, a first west pneumatic line $390W_1$ is shown being operably connected to the first and second west bellows $300AW_1$, $300AW_2$ of the first tracker 100A. Accordingly, because the first and second west bellows $300AW_1$, $300AW_2$ of the first tracker 100A share a common pneumatic line $390W_1$, pneumatic circuit 382 can drive, introduce fluid to, remove fluid from, and/or otherwise control the first and second west bellows $300AW_1$, $300AW_2$ in unison via the common pneumatic line $390W_1$.

Accordingly, with the first and second east bellows $300AE_1$, $300AE_2$ and the first and second west bellows $300AW_1$, $300AW_2$ being respectively configured to be driven in unison, the first and second actuators 101AA, 101AB of the first solar tracker 100A can be driven in unison, which allows for the set of photovoltaic cells 103A coupled to the first and second actuators 101AA, 101AB to be rotated laterally about a common axis that extends through the first and second actuators 101AA, 101AB.

While this example of FIG. 5 illustrates the first tracker 100A comprising a first and second actuator 101AA, 101AB, it should be clear that a plurality of actuators 101 can be driven or controlled in a similar manner, including trackers 100 having four actuators 101 as illustrated in FIGS. 1a, 1b and 4.

The second tracker 100B is shown having a similar configuration. More specifically, a second east pneumatic line $390E_2$ is shown being operably connected to the first and second east bellows $300BE_1$, $300BE_2$ of the second tracker 100B. Accordingly, because the first and second east bellows $300BE_1$, $300BE_2$ of the second tracker 100B share a common pneumatic line $390E_2$, pneumatic circuit 382 can drive, introduce fluid to, remove fluid from, and/or otherwise control the first and second east bellows $300BE_1$, $300BE_2$ in unison via the common pneumatic line $390E_2$.

Similarly, a second west pneumatic line $390W_2$ is shown being operably connected to the first and second west bellows $300BW_1$, $300BW_2$ of the second tracker 100B. Accordingly, because the first and second west bellows $300BW_1$, $300BW_2$ of the second tracker 100B share a common pneumatic line $390W_2$, pneumatic circuit 382 can drive, introduce fluid to, remove fluid from, and/or otherwise control the first and second west bellows $300BW_1$, $300BW_2$ in unison via the common pneumatic line $390W_2$.

As discussed herein, pneumatics can introduce and/or remove fluid from bellows 300 of one or more actuators 101. For example, pneumatics can actuate a plurality of actuators 101 associated with a solar tracker 100. In further examples, pneumatics can actuate a plurality of solar trackers 100 disposed in one or more rows. In various embodiments, a pneumatics system (e.g., including the pneumatic circuit 382, pneumatic lines 290, and the like) can comprise a plenum structure for a CADS harness, which in some embodiments can include a high flow capacity main line with flow restrictions 391 on bellows branches 392 to maintain main line pressure on long rows. In some embodiments, pneumatic routing can be disposed on the north side of all actuators of a tracking system 400. In further embodiments, pneumatic routing can be disposed exclusively on the south side of all actuators of the tracking system 400 or on both the north and south sides.

In some embodiments, (e.g., as shown in FIG. 5) flow restrictions 391 on some or all bellows branches 392 can be desirable for equalizing flow (and therefore motion rate) of some or all actuators 101 in a tracker 100, a row of trackers 100 or across rows of differing lengths and differing pneumatic impedance. The flow restrictions 391 can be tuned to equalize flow within a desired percentage range in accordance with various embodiments. Such configurations can equalize motion rate for some or all of the actuators (keeps panels matched) and can allow for more arbitrary field layout of pneumatic lines 390. Various embodiments can include a hermetic connector-to-bellow polymer-weld. Further embodiments can comprise air brake tubing and fittings for a solar application. In some embodiments, the pneumatic circuit 382, using low pressure, can pump between CADS channels rather than using a source/exhaust system. For example, the system can comprise a row controller 380 that pumps between CADS channels.

Some embodiments can comprise a replenish-leaks-on-power-loss function. For example, an additional low pressure regulator can be added to a row controller 380 or other portion of the solar tracking system 400, with a normally-open valve connecting it to a manifold cross-over. The valve can be held closed when the system is powered. When power is lost, the valve opens, replenishing any leaks from an attached high-pressure air tank. This can allow the solar tracking system 400 to maintain a stow position for an extended period of power-loss, even with leaks in the system.

In further embodiments the solar tracking system 400 can comprise a wind flutter damper-compressor. For example, some configurations can use the fluttering motion of a tracker 100 induced by wind to operate a compressor to augment air supply. One or more pistons (or bellows 300) distributed throughout the tracker 100 can generate additional makeup air to reduce energy consumption while also limiting the magnitude of any fluttering behavior preventing resonance. Additionally, some embodiments can comprise a double 5/2 valve arrangement, which can include a source or exhaust connected to east-output or west-output.

Figure 6:
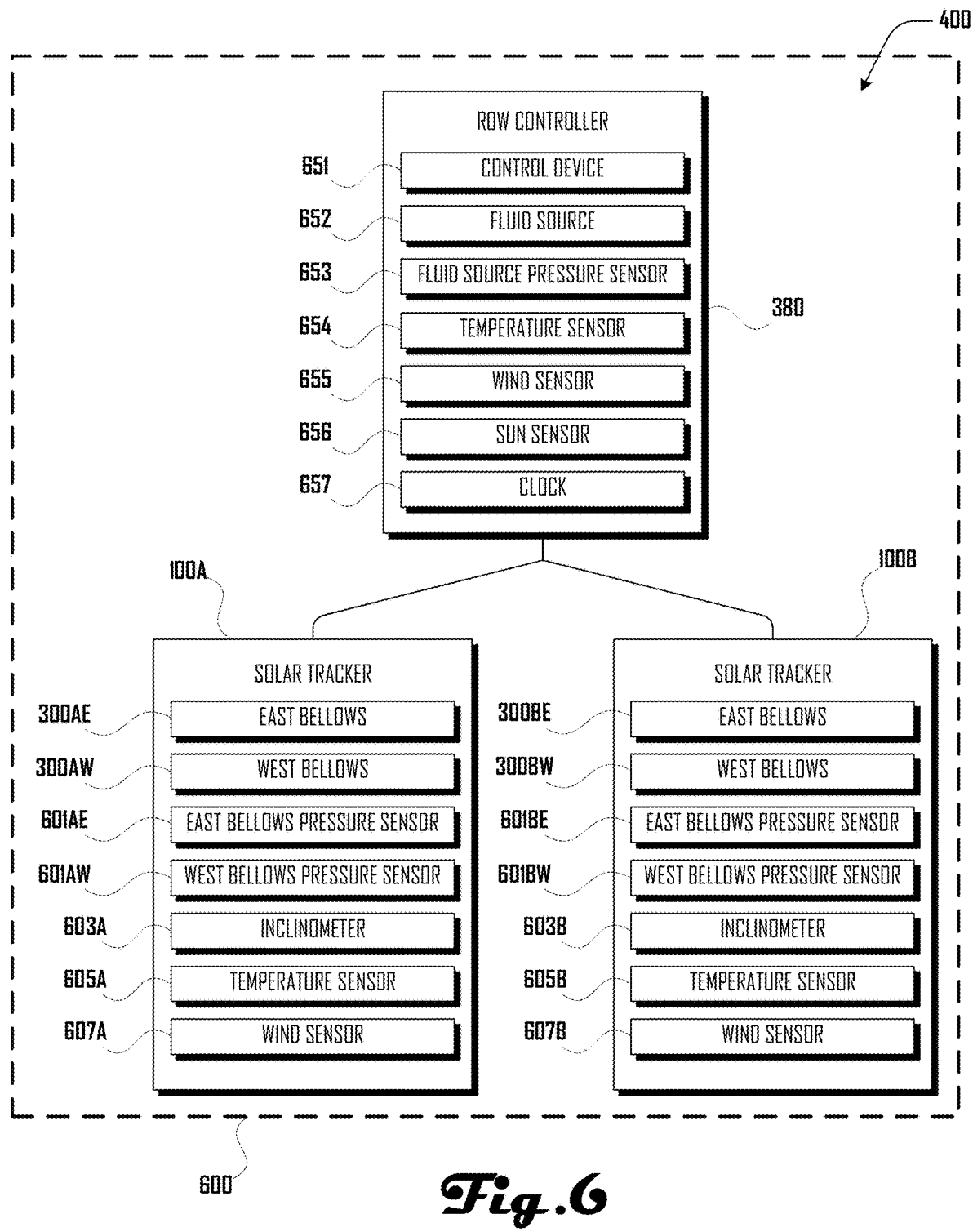
FIG. 6 is a block diagram of elements of a solar tracking system that includes a row controller and a first and second solar tracker.
Figure 14:
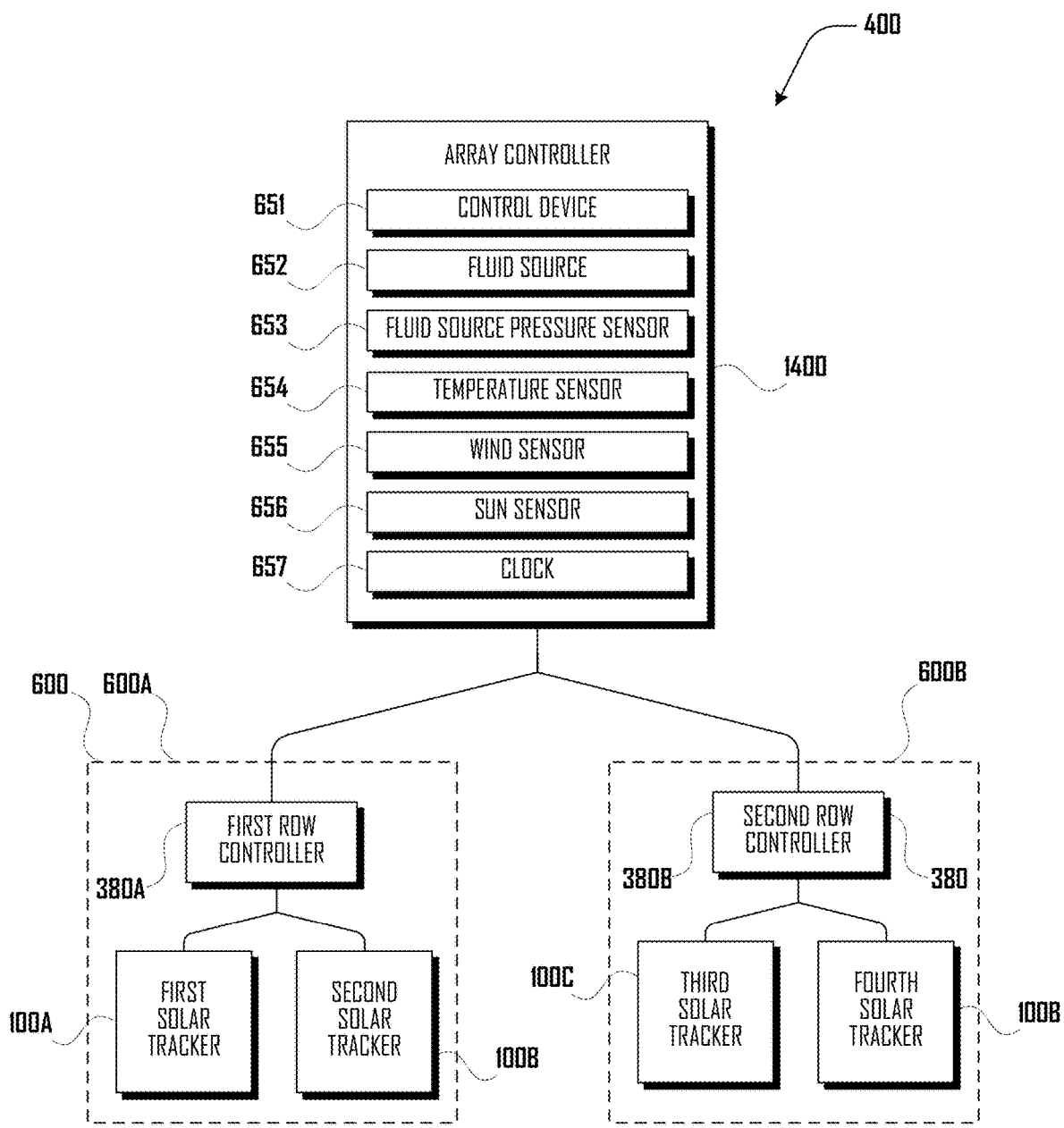
FIG. 14 is a block diagram of elements of a solar tracking system that includes an array controller, a first and second row controller and four solar trackers.

Turning to FIG. 6, a block diagram of a set of elements 600 of one example embodiment of a solar tracking system 400 is illustrated, which includes a row controller 380 and a first and second solar tracker 100A, 100B. The row controller 380 is shown comprising a control device 651, a fluid source 652, a fluid source pressure sensor 653, a temperature sensor 654, a wind sensor 655, a sun sensor 656 and a clock 657. FIG. 14 is a block diagram that illustrates another example embodiment of a solar tracking system 400 that comprises an array controller 1400 a first and second row controller 380 and a first, second, third, fourth solar tracker 100A, 100B, 100C, 100D.

The embodiments of FIGS. 6 and 14 are merely examples and should not be construed to be limiting on the wide variety of architectures of a solar tracking system 400 that are within the scope and spirit of the present disclosure. For example, some embodiments can include an array controller 1400 that controls one or more row controller 380, which in turn control one or more solar trackers 100. In some embodiments, one or both of the array controller 1400 and/or row controllers 380 can be absent, with one or more remaining elements performing sensing and/or control functions.

Additionally, while the array controller 1400, row controller 380 and solar tracker 100 are shown having a plurality of control and sensing elements, in some examples any shown elements can be absent or additional control and/or sensing elements can be present. In other words, in further examples, any of the array controllers 1400, row controller 380 and solar tracker 100 can be more or less complex and can have more or fewer elements compared to the examples of FIGS. 6 and 14.

For example, in some embodiments east/west bellows pressure sensors 601E, 601W can be disposed at one or more row controller 380 and/or array controller 1400 and not the solar trackers 100. In further embodiments, east/west bellows pressure sensors 601E, 601W can be disposed at one or more solar tracker 100, which in some embodiments can include east/west bellows pressure sensors 601E, 601W associated with one or more actuators 101 of such trackers 100. Still further embodiments can include east/west bellows pressure sensors 601E, 601W on every row of trackers 100, on every couple of rows of trackers 100, and the like.

Accordingly, in some examples, bellows sensors 601 can be co-located at one or more bellows 300 or can be associated with pneumatic lines associated with one or more bellows 300. For example, in some embodiments, bellows pressure sensors 601 can be respectively configured to sense the pressure of a single bellows 300 or the pressure of a group of bellows 300 including a plurality of east bellows 300E, a plurality of west bellows 300W, one or more bellows 300 from a plurality of trackers 100, and the like.

Also, any of the functions or methods described herein can be performed exclusively at one of an array controller 1400, row controller 380 and solar tracker 100 in some embodiments, or can be performed collectively by two or more of an array controller 1400, row controller 380 and solar tracker 100. For example, it should be appreciated that embodiments illustrating functions or method being performed by a row controller should be construed to be performed alternatively and/or additionally by one or both of an array controller 1400 and row controller.

In various embodiments, the control device 651 can be any suitable computing device, which can include a processor, memory, power source, networking hardware, and the like. The control device 651 can store computer readable instructions (e.g., software, firmware and the like) on one or more computer readable medium, which can control one or more pneumatic circuits 382, which can in turn drive or control one or more solar trackers 100 as described in more detail herein. In various embodiments, a pneumatic control unit 384 can comprise the control device 651 or vice versa. In some embodiments, the control device 651 can comprise a specialized embedded system or can comprise devices such as a smartphone, laptop computer, tablet computer or the like.

Some embodiments can comprise solar electrical string powered controls with no battery backup. For example, the array can be used to power controls. In one configuration, a large array 400 can have significant available energy even early in the morning before inverters start. A 50 kW array (e.g., including eight trackers 100) with 10 W/m^2 irradiance can generate 500 W which can be sufficient to power control systems. Even cloudy days can have more than enough power to run a compressor. Such embodiments can be employed with or without battery backup. Additionally, the control system can be configured to move one or more trackers 100 of an array 400 away from vulnerable positions before energy is lost for the day. In such examples, a stow-on-power-loss function can be desirable.

While backup power can be provided via a battery, further embodiments can comprise a wind turbine to provide backup power (or backup air supply) during wind events combined with power outages. Risks to a solar array structure can be greatest during extreme wind events, and using wind to provide energy can help guarantee that energy is available when needed.

While some embodiments include the control device 651 being located onsite and proximate to one or more solar trackers 100 being controlled, further embodiments can include the control device 651 or portions thereof being located in a disparate location from the solar trackers 100. For example, in some embodiments, control device 651 or portions thereof can be embodied in one or more physical or virtual computing devices located away from the solar trackers 100 and control data and sensing data can be communicated to and from such a disparate location via various suitable networks, including a cellular network, satellite network, the Internet, a WiFi network, microwave network, a laser network, a serial communications system, or the like.

The fluid source 652 can comprise any suitable container for storing fluid. For example, in embodiments where air is used as a fluid for controlling bellows 300 of one or more solar trackers 100, the fluid source 652 can comprise one or more air tank and/or air compressor of any suitable size and shape. While some embodiments include a fluid source 652 at the row controller 380, further embodiments can include one or more fluid sources 652 proximate to one or more solar trackers 100. For example, where a plurality of solar trackers 100 are disposed in a row, a fluid source can be disposed at an end of a row. Additionally, where other fluids (e.g., oxygen, nitrogen, water, oil, or the like) are used, a fluid source 652 can be configured to store such fluids.

A fluid source pressure sensor 653 can be associated with a fluid source 652 and can be configured to sense a pressure associated with the fluid source 652. Additionally in further embodiments, the pressure sensor 653 or other sensors can be configured to sense a volume of fluid present within the fluid source 652. Data associated with a pressure, volume or the like, of a fluid source can be used as discussed in more detail herein.

The row controller 380 and/or array controller 1400 can comprise various additional sensors, including a temperature sensor 654, a wind sensor 655, a sun sensor 656, and the like. As discussed herein, a temperature sensor 654 can be configured to sense a temperature associated with, and can be configured to determine a fluid volume, or the like, within various portions of a solar tracking system 400, including the fluid source 652, pneumatic lines 370, pneumatic circuit 382, or the like. A wind sensor 655 can be used to determine wind speed or velocity near the row controller 380, which as discussed herein can be used to determine whether one or more solar trackers 100 should be moved to a stowed position to prevent wind damage to the solar trackers 100, whether rigidity of one or more actuators 101 should be increased or decreased, or whether an alert should be sent to a user regarding wind conditions.

As discussed herein, a solar tracking system 400 can be configured to move one or more solar trackers 100 to track the position or angle of the sun, which can be desirable for maximizing electrical energy generated by photovoltaic cells 103 of the system 400. In some embodiments, the sun sensor 656 can be used to determine an angle or position of the sun, which can be used to determine how the solar trackers 100 should be driven as discussed herein. However, in further embodiments, a sun sensor 656 can be absent and an angle or position of the sun can be determined in other ways.

In various embodiments, a clock 657 can be used to determine an angle or position of the sun. For example, where the location of the solar tracking system 400 and/or components thereof are known (e.g., via GPS or a defined location indicator), astrological charts can be consulted which can identify a position or angle of the sun at the location at a time defined by the clock 657. Accordingly, in various embodiments, the row controller 380 can store or otherwise have access to astrological charts that identify what the angle and/or position of the sun will be at various times in the future relative to one or more locations.

A row controller 380 is shown being operably connected to first and second solar trackers 100A, 100B in FIG. 6. An array controller 1400 is shown as being operably connected to a first and second row controller 380 in FIG. 14. Such an operable connection can include a fluidic and/or data communication connection with the solar trackers 100 and/or row controller 380 in the case of array controller 1400. For example, a fluidic connection can include fluidic lines 390 (see FIGS. 3 and 5) that allow fluid to travel from the array controller 1400 and/or row controller 380 to the one or more solar trackers 100 and/or vice versa. However, in some embodiments, where a fluid source 652 is absent at the row controller 380 and/or array controller 1400, such a fluidic connection can be absent. For example, where one or more fluid sources 652 are located at one or more trackers 100, an operable connection between the row controller 380 and the one or more trackers 100 can include only a data communication connection. In another example, one or more trackers 100 can be self-powered with distributed air compressors or pumps.

In various embodiments, a data communication connection can include any suitable wired and/or wireless communication channel that allows data to pass from the array controller 1400 to one or more row controller 380, from one or more row controllers 380 to the one or more solar trackers 100 and/or vice versa. For example, in some embodiments, sensing data from the one or more solar trackers 100 can be communicated to the one or more row controllers 380 and/or array controller 1400 as discussed herein, which can inform control of the one or more solar trackers 100 by a row controller 380 and/or array controller 1400. Additionally or alternatively, control data, or other suitable data (e.g., sensing data) can be communicated to the one or more solar trackers 100 from the row controller 380 and/or array controller 1400. For example, where valves or other components are present at the one or more trackers 100, such valves or components can be controlled via data sent to the one or more trackers 100 from a row controller 380 and/or an array controller 1400 that controls a plurality of row controllers 380.

The solar trackers 100A, 100B can include a respective one or more east bellows 300AE, 300BE that are associated with one or more respective east bellows pressure sensors 601AE, 601BE. Solar trackers 100A, 100B can further include a respective one or more west bellows 300AW, 300BW that are associated with one or more respective west bellows pressure sensors 601AW, 601BW. For example, as discussed and shown herein (e.g., in FIGS. 1a, 1b, 4 and 5), a solar tracker 100 can comprise one or more actuators 101 that each comprise a pair of bellows 300.

In various embodiments, a bellows pressure can be used to determine an inflation/deflation state of the bellows 300, a volume of fluid present in the bellows, and the like, which can be desirable for monitoring and controlling the bellows 300 of a solar tracking system 400. Some embodiments can include one or more pressure sensor 601 associated with a given bellows 300, whereas further embodiments can include pressure sensors associated with only a subset of bellows 300. Pressure sensors can be disposed proximate to, within or on a bellows 300 or can be operably coupled to a fluidic line 390 or branch 392 associated with one or more bellows 300. Bellows pressure data obtained from one or more pressure sensors 601 can be used as discussed in more detail herein.

Additionally, the solar trackers 100A, 100B can comprise various additional sensors, including respective inclinometers 603A, 603B, temperature sensors 605A, 605B, wind sensors 607A, 607B, and the like. In various embodiments, an inclinometer 603 can measure an angle of slope or tilt of the photovoltaic cells 103 associated with a tracker 100. For example, an inclinometer 603 can measure an angle of slope or tilt associated with a tracker 100 being in a neutral configuration N, maximum tilts A, B, or any other configurations therebetween, as shown in FIG. 2. Such an identified angle of slope or tilt associated with photovoltaic cells 103 can be used to determine the position of the photovoltaic cells 103 of the tracker 100 relative to a position or angle of the sun as discussed in more detail herein.

In some embodiments, a tracker 100 can comprise one or more inclinometers 603 that can be coupled with or associated with various portions of a tracker 100, including a top plate 330, actuator 101, photovoltaic cells 103, or the like. Additionally, in further embodiments, inclinometers 603 can be absent and/or other suitable sensors can be used to determine an angle of slope or tilt associated with photovoltaic cells 103.

As discussed herein, temperature sensors 605A, 605B can be configured to determine a temperature associated with, and configured to determine a fluid volume, or the like, within various portions of a solar tracking system 400, including the bellows 300, pneumatic lines 370 or the like. The wind sensors 607A, 607B can be used to determine wind speed or velocity near solar trackers 100A, 100B, which as discussed herein can be used to determine whether one or more solar trackers 100 should be moved to a stowed position to prevent wind damage to the solar trackers 100, whether rigidity of one or more actuators 101 should be increased or decreased, or whether an alert should be sent to a user regarding wind conditions.

In further embodiments, control of a solar tracking system 400 can comprise temperature and humidity abatement via pneumatic venting, which can include opening both fill and vent valves in a row controller 380 or other suitable location and/or using an orificed connection for a row controller 380. Further control system embodiments can comprise modifying/controlling Voc (open circuit voltage), which can be desirable for reducing design constraints (e.g., string length) and improve cost of inverters, combiner boxes, wiring, and the like. Some embodiments can include modifying/controlling Isc (short circuit current), which can reduce design constraints (e.g., current) and can improve the cost of inverters, combiner boxes, wiring, and the like. Still further embodiments can comprise modulating the tracker position to increase convection and therefore increase operating voltage and energy output.

In some instances, it can be desirable to reduce the range of motion of one or more tracker 100, including by limiting the range of motion of one or more actuator 101, bellows 300, or other suitable portion of a tracker 100. For example, limiting the range of motion of one or more tracker 100 can be performed in response to environmental or system conditions, including elevated wind events, high temperature events, low temperature events, and the like. Limiting the range of motion of the tracker 100 can include limiting the range of motion of a tracker 100 to a smaller range of motion compared to a standard range of motion of the tracker 100, with some examples including immobilizing the tracker 100. In some examples, generating a stow of a tracker 100 can include limiting the range of motion of the tracker 100 in response to a stow event.

Some embodiments can comprise off-angle tracking for electrical current health inspection. For example, off-angle tracking during high irradiance hours can provide an indication of string level health or health of a row controller's worth of panels. In some embodiments, such a determination can comprise measuring a dip in current output when portions of an array's tracker are pointed away from the sun. Where actuators 101 or other portions of a tracker 100 are broken, wiring is wrong, or the like, less of a dip would be observed, which could indicate an issue with the system in that portion. On the other hand, where actuators 101 or other portions of a tracker 100 are healthy, larger dips during off-sun tracking would be observed, which could indicate that portion of the system being healthy. Further embodiments can comprise a pressure/position check to monitor bellows for material degradation or other defects.

Some embodiments can use pulse width modulation (PWM) or proportional voltage or current control to control valves instead of calculated open-time in order to optimally utilize valve cycle life and minimize tracker twist due to long valve open times. Further embodiments can be configured to monitor pressures/angles of one or more actuators 101 to determine a leak location. For example, leaks can be predicted if pressures/angles in a particular row or tracker 101 are changing differently than other rows/trackers, or differently than expected based on temperature variations and other factors. This can allow leaks to be located on the row-level or tracker-level. Leaks can be located even more precisely, in still further embodiments, with more sensors and/or by learning the system response to leaks as a function of leak location, and adapting control code to recognize patterns that are characteristic of specific leak locations.

While FIG. 6 and the examples discussed herein illustrate specific example embodiments of a solar tracking system 400, these examples should not be construed to be limiting on the wide variety of suitable configurations of a solar tracking system 400. For example, any of the elements can be absent in some embodiments, or can be present in a plurality in some embodiments. Additionally, various sensors or elements shown located at the row controller 380 can alternatively, or additionally, be located at the solar trackers 100, or vice versa. Also, it should be clear that the example sensors or elements shown in FIG. 4 can be replaced or augmented by suitable equivalents or other sensors or elements that provide for similar functionalities.

Figure 7:
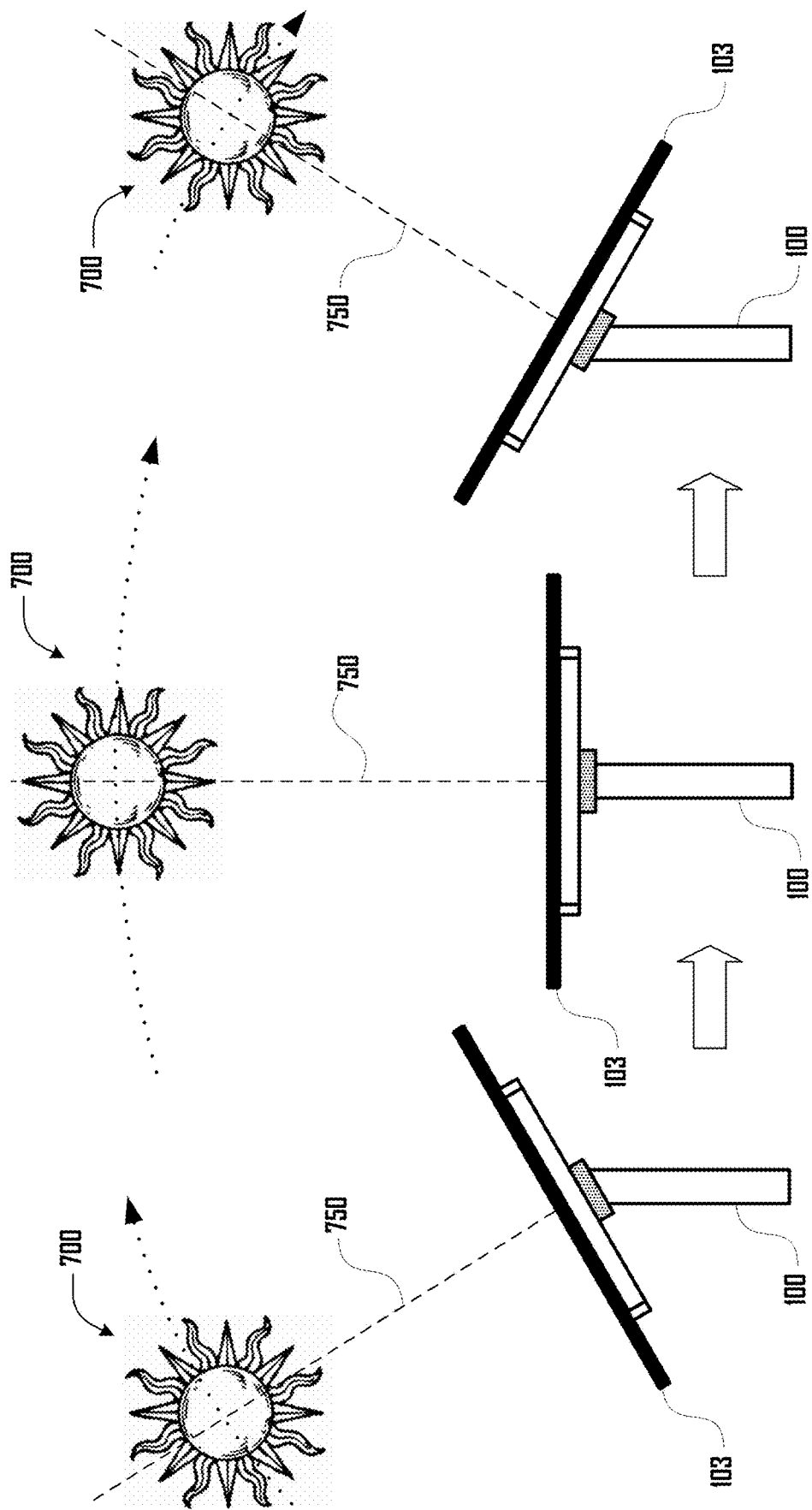
FIG. 7 illustrates an example of a tracker tracking the position of sun throughout the day as the sun moves through the sky.

FIG. 7 illustrates an example of a tracker 100 tracking the position of sun 700 throughout the day as the sun 700 moves through the sky. As shown in this example, one or more photovoltaic cells 103 disposed on the tracker 100 are oriented facing the sun 700 such that tracker axis 750, which is perpendicular to the planar face of the photovoltaic cells 103, is coincident with the sun 700. Accordingly, as shown in this example, the tracker 100 can pivot the photovoltaic cells 103 throughout the day (e.g., via actuators 101) to match the angle or location of the sun 700 such that the photovoltaic cells 103 receive maximum sun exposure, which can maximize generation of electrical current by the photovoltaic cells 103.

However, in further embodiments, a tracker 100 can track the changing position or angle of the sun 700 in various suitable ways. For example, while the example of FIG. 7 illustrates tracking such that tracker axis 750 is coincident with the center of the sun 700, in further embodiments, it can be desirable to track the sun 700 with tracker axis 750 not being coincident with the center of the sun 700.

For example, in some embodiments, photovoltaic cells 103 can be configured with an optimal exposure angle that is not directly perpendicular to the planar face of the photovoltaic cells 103. In further examples, heat generated at the photovoltaic cells 103 via exposure with tracker axis 750 being coincident with the center of the sun 700 can reduce electrical output, so pointing the tracker 700 off-center of the sun can be desirable in some embodiments. Additionally, variables like angle or position of the sun in the sky, weather conditions, or the like can also affect an optimal exposure angle of the photovoltaic cells 103. Accordingly, the examples herein should not be construed as limiting.

Figure 8:
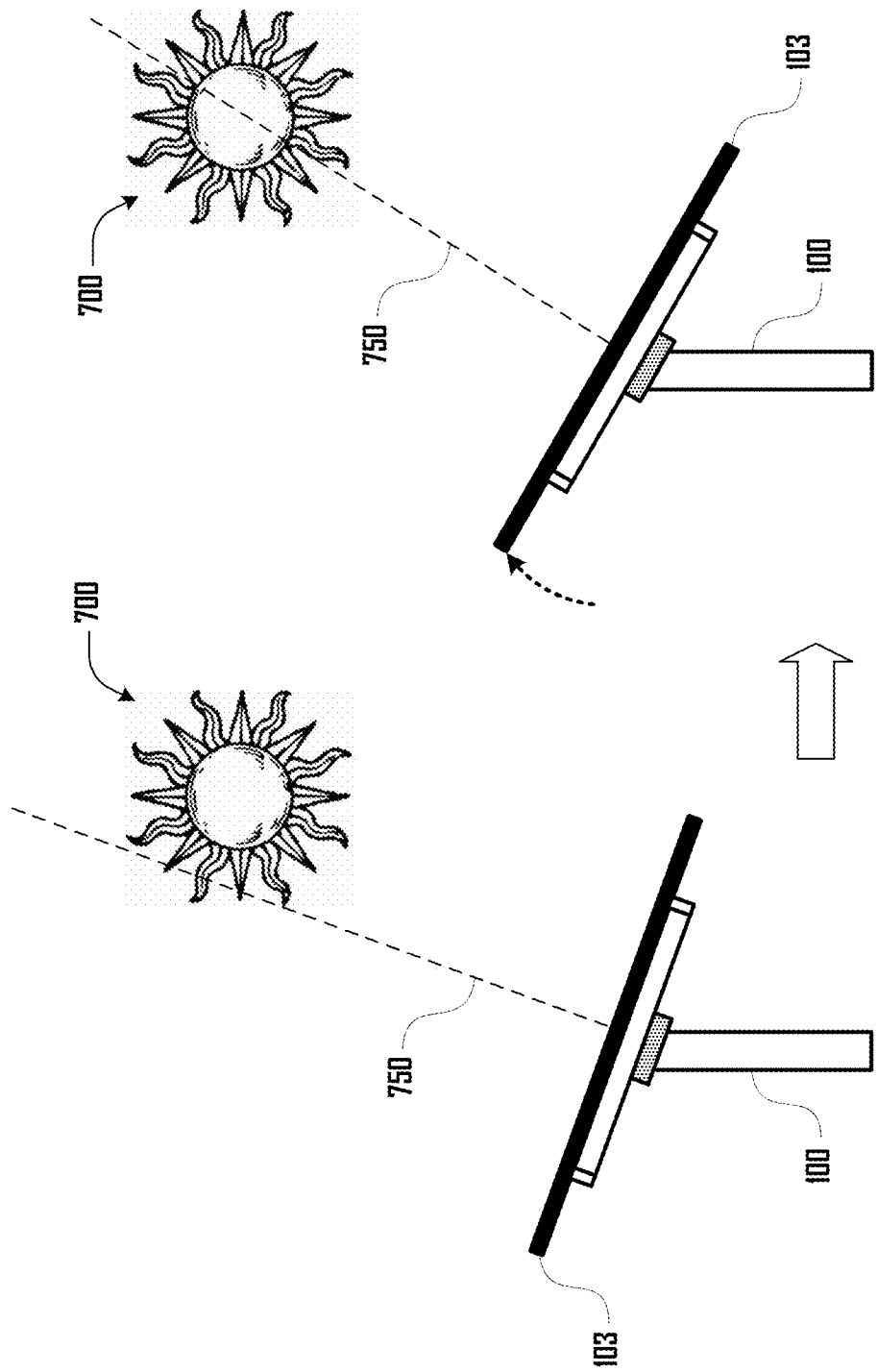
FIG. 8a illustrates an example of a tracker being in a non-ideal position relative to the sun and FIG. 8b illustrates moving the tracker to an ideal position with the tracker axis being coincident with the center of the sun.

Turning to FIGS. 8a and 8b, an example of a tracker 100 being in a non-ideal position relative to the sun 700 is shown in FIG. 8a and moving the tracker 100 to an ideal position with tracker axis 750 being coincident with the center of the sun 700 is shown in FIG. 8b. As discussed herein, it can be desirable for solar trackers 100 to track the position or angle of the sun 700 to maximize electrical current output by photovoltaic cells 103 on the tracker 100. For example, where it is determined that the current angle of the photovoltaic cells 103 of the tracker 100 is not within a desirable range of an optimal exposure angle of the photovoltaic cells 103, then the tracker 100 can be tilted so that the photovoltaic cells 103 are positioned within a desirable range of an optimal exposure angle of the photovoltaic cells 103. Using the examples of FIGS. 8a and 8b, in FIG. 8a, it can be determined that the tracker 100 is in a non-ideal configuration and can be moved to, or within a range of an ideal configuration, for example, by rotating the photovoltaic cells 103 to the right as shown in FIG. 8b.

Figure 9:
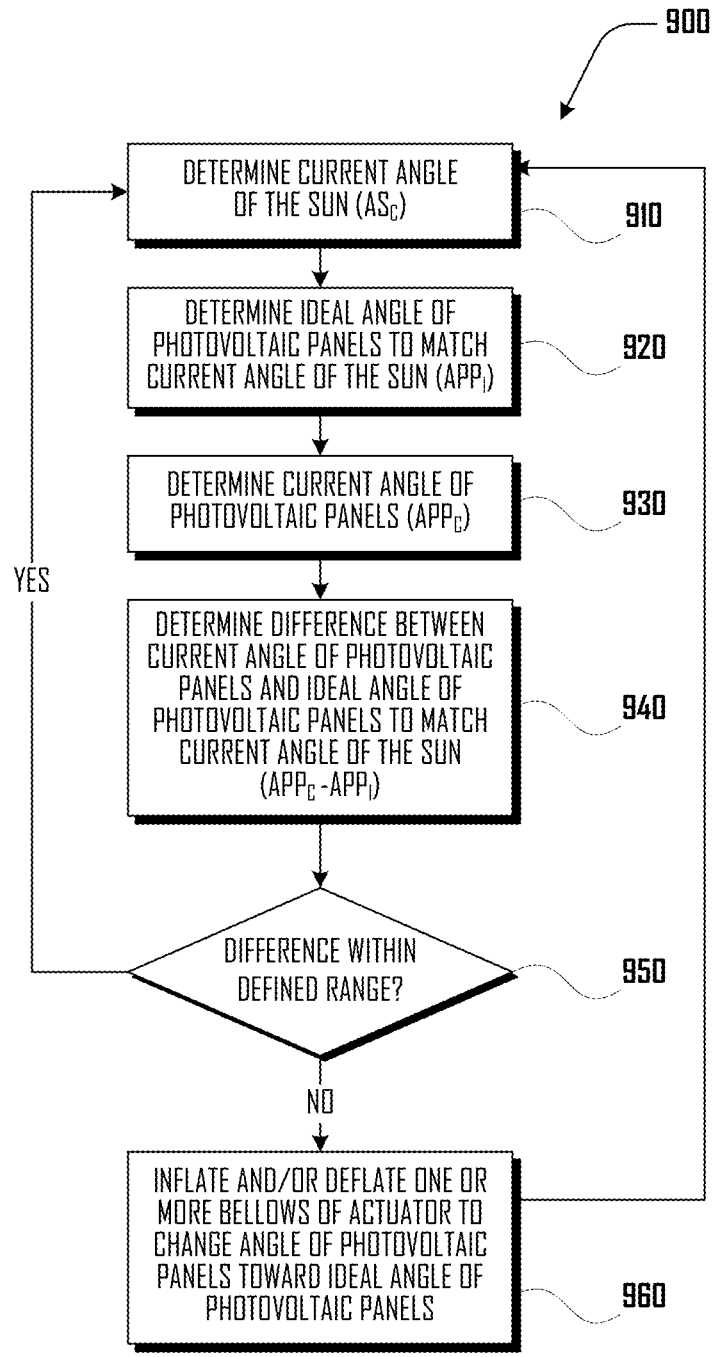
FIG. 9 illustrates an example method of controlling one or more solar trackers to match the angle or position of the sun.

FIG. 9 illustrates an example method 900 of controlling one or more solar trackers 100 to match the angle or position of the sun. For example, in various embodiments a pneumatic control unit 384 (FIGS. 3 and 5) or control device 651 (FIG. 6) can be configured to perform the method 900 of FIG. 9, or the like.

The method 900 begins at 910, where a current angle or position of the sun is determined. For example, in some embodiments a current angle of the sun can be determined based on a determined time (e.g., via a clock 657 in FIG. 6), a determined or defined position of a tracker 100 or solar tracking system 400, and based on astrological sun charts that indicate sun position based on time and location. In further embodiments, a current angle or position of the sun can be determined based on a sun sensor 656 (FIG. 6) or other suitable method or device.

The method 900 continues at 920 where an ideal angle of the photovoltaic panels 103 to match the current angle of the sun is determined. For example, as discussed herein, such an ideal angle of the photovoltaic panels 103 can be an angle where the tracker axis 750 is coincident with the center of the sun 700 (see e.g., FIGS. 7 and 8b) or other suitable angle, which can include an angle that maximizes the electrical output of the photovoltaic cells 103.

At 930, a current angle of the photovoltaic cells 103 is determined, and at 940 a difference between the current angle of the photovoltaic cells 103 and the ideal angle of the photovoltaic cells 103 is determined. For example, as discussed herein, in some embodiments, one or more inclinometer 603A, 603B of a respective solar tracker 100 can be used to identify a current angle of the photovoltaic cells 103.

The method 900 continues at 950 where a determination is made whether the difference between the current angle of the photovoltaic cells 103 and the ideal angle of the photovoltaic cells 103 is within a defined range. For example, in various embodiments, a tolerance range about an ideal angle of the photovoltaic cells 103 can be desirable to allow for movements of the photovoltaic cells 103 in the wind; to conserve energy by not requiring constant movement of the photovoltaic cells 103 to maintain an exact ideal angle, and the like. For example, such a tolerance range can be +/−0.5°, +/−1.0°, +/−2.0°, +/−3.0°, +/−5.0°, +/−10.0°+/−15.0° and the like. Additionally, such a tolerance range can be symmetrical about an ideal angle as shown in the examples above or can be asymmetrical. Additionally, such a tolerance range can be static or dynamic based on various factors, including the current angle of the sun, weather conditions, or the like.

If a determination is made at 950 that the difference between the current angle of the photovoltaic cells 103 and the ideal angle of the photovoltaic cells 103 is not within a defined range, then the method 900 continues to 960 where bellows 300 of one or more actuators 101 of one or more trackers 100 are inflated and/or deflated to change the angle of the photovoltaic panels 103 toward the determined ideal angle for the photovoltaic panels 103. However, if at 950 a determination is made that the difference between the current angle of the photovoltaic cells 103 and the ideal angle of the photovoltaic cells 103 is within the defined range, then the method 900 cycles back to 910.

Accordingly, in various embodiments, the position of one or more trackers 100 can be monitored to determine whether the angle of the trackers 100 is within a tolerance range of an ideal angle, and if not, the trackers 100 can be actuated to be within the tolerance range. In various embodiments, such monitoring and control can be applied to all trackers 100 within a solar tracking system 400 or one or more subsets of trackers 100 can be monitored and controlled separately. For example, in some embodiments, it can be desirable to control trackers 100 individually based on individual current angles of the trackers 100 and/or individual locations of the trackers 100. Also, such monitoring and control can be performed continuously or can be performed periodically. For example, the method 900 can be performed on a time delay every second, five seconds, ten seconds, sixty seconds, five minutes, fifteen minutes, thirty minutes, or the like.

In various embodiments, solar trackers 100 can enable tweaking of photovoltaic system performance characteristics to capture additional value. For example, open circuit voltage of photovoltaic cells 103 can increase as temperature decreases. Overall system design of some embodiments can be dictated by a maximum voltage that occurs very infrequently (e.g., on the coldest mornings of the coldest days of the year). Intelligent tracking can ameliorate this worst case scenario and can improve project design economics.

To avoid this scenario, controls of some embodiments can leverage another principle of photovoltaic cells 103; namely that cell voltage can also be related to incident light. By pointing the trackers 100 somewhere other than directly at the sun, resulting in fewer photons striking the photovoltaic cells 103, system voltage is reduced. When photovoltaic cell 103 temperature rises from a combination of ambient temperature and direct solar heating of the photovoltaic cells 103, system voltage can be reduced further, and the trackers 100 can then return to a position with maximum incident light on the photovoltaic cells 103.

This application can include a combination of design features such as detecting photovoltaic cells string voltage (e.g., directly or through query of some other system device such as an inverter), sensing of ambient temperature or photovoltaic cells' temperature, measurement of direct or indirect solar irradiance, and the like.

One benefit of being able to relax the constraint of minimum design temperature in some embodiments can be the potential for more photovoltaic cells 103 (and system power) per infrastructure investment. For example, wiring can be done per string, combiner boxes accept a maximum number of strings, and the like. If the number of photovoltaic cells 103 per string increases by 5%, the same amount of power can be generated with 5% fewer strings, and the infrastructure investment associated with those eliminated strings can be avoided. There is also potential for reduction in installation labor, as wiring of additional strings is much more involved than additional photovoltaic cells 103.

Additionally, higher system voltage can drive additional system efficiency by reducing the string current at a fixed power output. This can be directly valued in additional energy production, or can enable other system savings through reduction of conductors or the like. Further embodiments can comprise moving photovoltaic cells 103 using intelligent algorithms to improve performance or system design.

Figure 10:
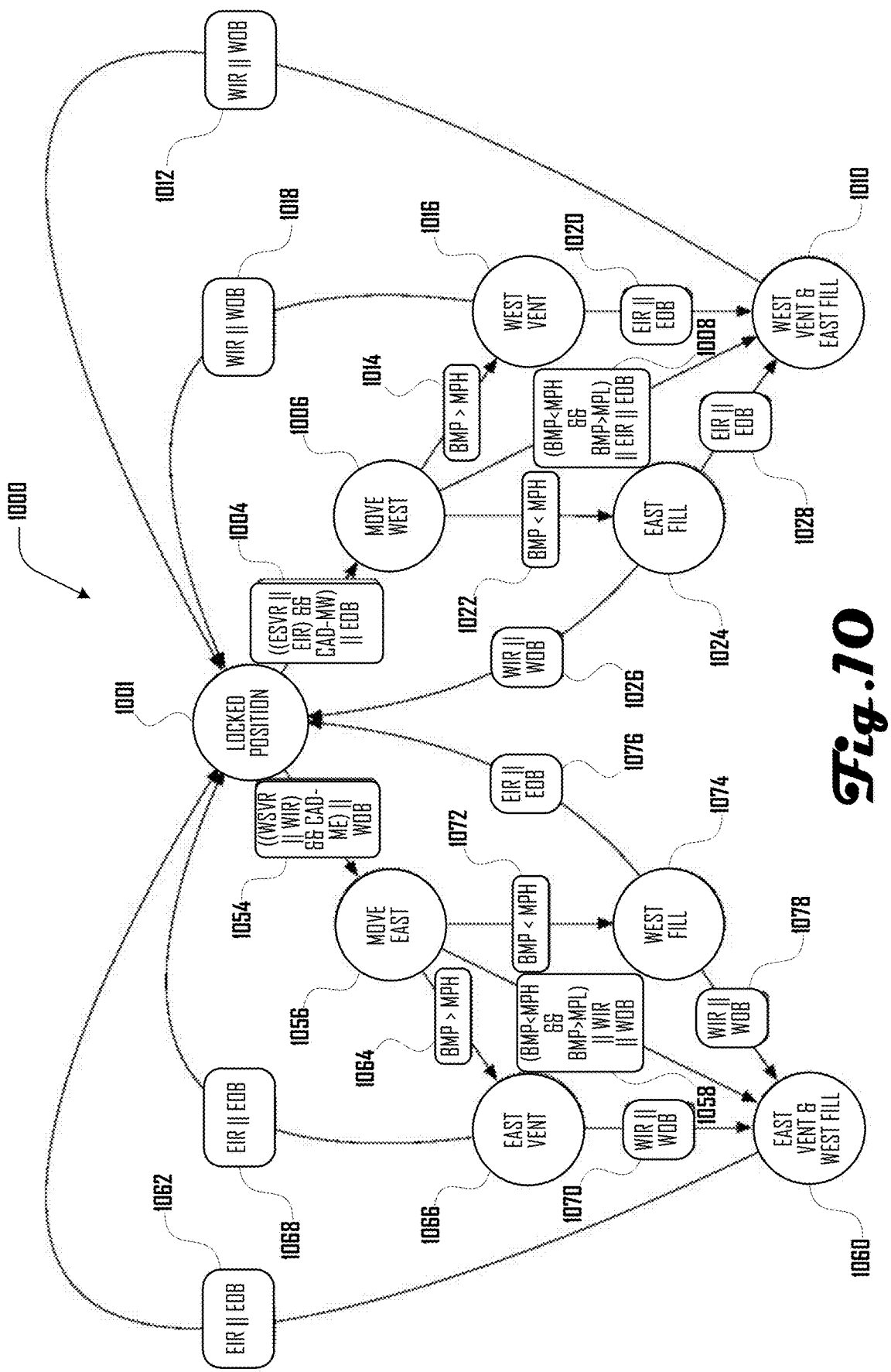
FIG. 10 illustrates a state diagram associated with controlling one or more solar trackers.
Figure 11:
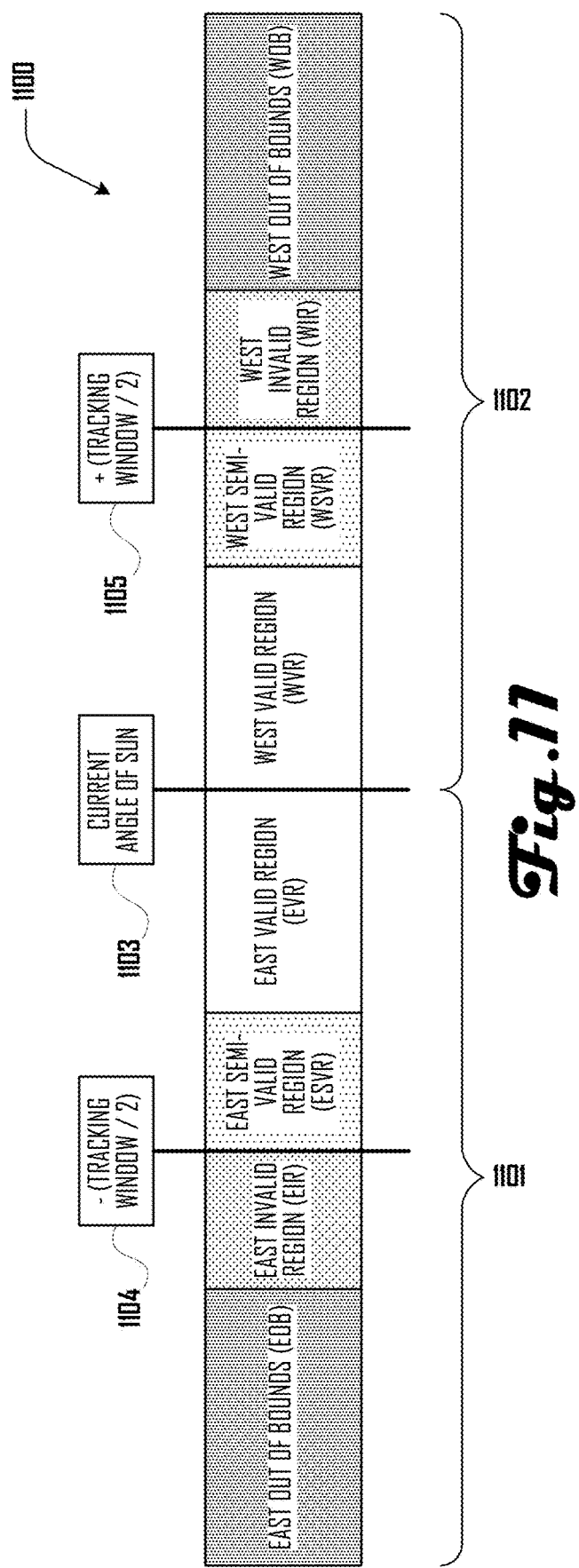
FIG. 11 illustrates a tracking window that can be used by the when controlling one or more solar trackers.

Turning to FIGS. 10 and 11, a state diagram 1000 is shown in FIG. 10 with reference to a tracking window 1100 illustrated in FIG. 11. As shown in FIG. 11, the tracking window 1100 can comprise a negative east tracking window portion 1101 and a positive west tracking window portion 1102 that have equal size on opposing sides of a current angle of the sun 1103. A negative east tracking window half 1105 separates an east invalid region (EIR) and an east semi-valid region (ESVR). A positive west tracking window half 1105 separates a west semi-valid region (WSVR) and a west invalid region (WIR). An east out of bound region (EOB) and west out of bounds region (WOB) are on distal ends of the tracking window 1100. An east valid region (EVR) and west valid region (WVR) are separated by the current angle of the sun 1103.

As discussed herein, control determinations can be made for one or more trackers 100 based at least in part on a determination of where a current angle of the tracker 100 is within the tracking window 1100 compared to the current angle of the sun or an ideal tracker target angle. Turning to FIG. 10, where a tracker 100 is in a locked position 1001, if at 1004 the tracker 100 is determined to be in the east semi-valid region (ESVR) or in the east invalid region (EIR) and the current destination angle is moving west CAD-MW, then the tracker 100 is actuated to move west 1006. Additionally, where the tracker 100 is in a locked position 1001 and the tracker 100 is determined at 1004 to be in the east out of bounds region (EOB), then the tracker 100 can be actuated to move west 1006.

For example, a locked position for the tracker 100 can include various configurations, including a stopped configuration where the tracker 100 is not being actuated by fluid being introduced and/or removed from the bellows 300 such that the actuators 101 are in a state of equilibrium. Such a locked configuration may or may not include a mechanical locking mechanism in addition to an equilibrium state between bellows 300 of one or more actuators 101. In some embodiments, a locked state can comprise valves associated with the bellows 300 being in a closed configuration.

Also, equilibrium between bellows 300 of an actuator 101 can include a range of pressures. For example, where bellows pressures of X:X generate equilibrium of an actuator 101 such that the actuator 101 does not move, bellows pressures of 2X:2X, 5X:5X, 10X:10X and the like, can also generate equilibrium of an actuator 101. In various embodiments, higher pressures of equilibrium can generate more stiffness in the actuator 101, which can be desirable for resisting external forces (e.g., wind) that may cause rotation of the photovoltaic cells 103. However, higher pressures in the bellows 300 can require more fluid and energy, which may undesirably consume more energy than necessary and/or cause more wear on bellows 300 or other components of a tracker 100. Accordingly, in some embodiments, it can be desirable to keep relative pressure between bellows 300 as low as possible to maintain appropriate function of the tracker 100.

Returning to the state diagram 1000 of FIG. 10, if the tracker 100 is moving west 1006 and it is determined at 1008 that the bellows 300 with most pressure (BMP) has a pressure that is less than a max pressure high (MPH) and where bellows 300 with most pressure (BMP) also has a greater pressure than a max pressure low (MPL), then at 1010, the west bellows 300W of the tracker 100 will vent and the east bellows 300E will fill.

For example, as discussed above, high fluid pressure in bellows 300 can cause undesirable wear on the bellows 300 and can even cause failure of the bellows 300 or related components. Accordingly, a max pressure high (MPH) can be defined for the bellows 300, which can be based on a maximum bellows operating pressure that limits undesirable wear on the bellows 300 and is below a pressure that would cause failure of the bellows 300.

Similarly, while low bellows operating pressures can be desirable for consuming less energy and limiting wear on the bellows 300 and other components, low bellows operating pressures below a certain threshold can be inadequate for desirable operation of the actuators 101 of a tracker 100. Accordingly, a max pressure low (MPL) can be defined for a lowest desirable operating pressure of bellows 300 of a tracker 100.

Some embodiments can comprise variable max pressure high (MPH) and/or a max pressure low (MPL). In one example, material creep reduction can include adjusting a control method to have a max bellow pressure dependent on external loads (e.g., reduce pressure when wind speed is low and increase pressure as wind speed increases). The reduced average pressure over time can limit material creep. In another example, a constant bellows stress function can include increasing pressure at a flat configuration (e.g., parallel to the ground) to provide more stiffness in stow, which can also provide better accuracy and decrease material fatigue. Bellows stress can be inversely proportional to angle, and proportional to pressure. High pressure at low angle in some embodiments can allow for roughly constant bellows material stress throughout the range of motion of the actuator 101. Additionally, changing peak pressures can be desirable for controlling the resonant modes and stiffness of a tracker and portions thereof. For example, changing peak pressures can be desirable for withstanding force generated by winds as discussed herein.

Returning to the state diagram 1000 of FIG. 10, where the tracker 100 is moving west 1006 and it is alternatively determined at 1008 that the tracker 100 is in the east invalid region (EIR) or is in the east out of bounds region (EOB), then at 1010, the west bellows 300W of the tracker 100 will vent and the east bellows 300E will fill. Where, at 1010, the west bellows 300W of the tracker 100 are venting and the east bellows 300E are filling, if it is determined at 1012 that the tracker 100 is in the west invalid region (WIR) or is in the west out of bounds region (WOB), then the tracker 100 assumes a locked position 1001.

However, where the tracker 100 is moving west 1006 and it is alternatively determined at 1014 that the bellows with most pressure (BMP) has a pressure that is greater than the max pressure high (MPH), then the west bellows 300W of tracker 100 vent at 1016. Where the west bellows 300W of the tracker 100 are venting west at 1016 and it is determined at 1018 that the tracker 100 is in the west invalid region (WIR) or is in the west out of bounds region (WOB), then the tracker 100 assumes a locked position 1001. Alternatively, if it is determined at 1020 that the tracker 100 is in the east invalid region (EIR) or is in the east out of bounds region (EOB), then at 1010, the west bellows 300W of the tracker 100 will vent and the east bellows 300E will fill.

However, where the tracker 100 is moving west 1006 and it is alternatively determined at 1022 that the bellows with most pressure (BMP) has a pressure that is less than the max pressure high (MPH), then the east bellows 300E of tracker 100 fill at 1024. Where the east bellows 300E of the tracker 100 are filling at 1024 and it is determined at 1026 that the tracker 100 is in the west invalid region (WIR) or is in the west out of bounds region (WOB), then the tracker 100 assumes a locked position 1001. Alternatively, if it is determined at 1028 that the tracker 100 is in the east invalid region (EIR) or is in the east out of bounds region (EOB), then at 1010, the west bellows 300W of the tracker 100 will vent and the east bellows 300E will fill.

Similar actions can occur on the left half of the state diagram 1000 of FIG. 10. For example, where a tracker 100 is in a locked position 1001, if at 1054 the tracker 100 is determined to be in the west semi-valid region (WSVR) or in the west invalid region (WIR) and the current destination angle is moving east (CAD-ME), then the tracker 100 is actuated to move east 1056. Additionally, where the tracker 100 is in a locked position 1001 and the tracker 100 is determined at 1054 to be in the west out of bounds region (WOB), then the tracker 100 can be actuated to move east 1056.

If the tracker 100 is moving east 1056 and it is determined at 1058 that the bellows 300 with most pressure (BMP) has a pressure that is less than a max pressure high (MPH) and where bellows 300 with most pressure (BMP) also has a greater pressure than a max pressure low (MPL), then at 1060, the east bellows 300E of the tracker 100 will vent and the west bellows 300W will fill.

Where the tracker 100 is moving east 1056 and it is alternatively determined at 1058 that the tracker 100 is in the west invalid region (WIR) or is in the west out of bounds region (WOB), then at 6010, the east bellows 300E of the tracker 100 will vent and the west bellows 300W will fill. Where, at 1060, the east bellows 300E of the tracker 100 are venting and the west bellows 300W are filling, if it is determined at 1062 that the tracker 100 is in the east invalid region (EIR) or is in the east out of bounds region (EOB), then the tracker 100 assumes a locked position 1001.

However, where the tracker 100 is moving east 1056 and it is alternatively determined at 1064 that the bellows with most pressure (BMP) has a pressure that is greater than the max pressure high (MPH), then the east bellows 300E of the tracker 100 vent at 1066. Where the east bellows 300E of the tracker 100 are venting at 1066 and it is determined at 1068 that the tracker 100 is in the east invalid region (EIR) or is in the east out of bounds region (EOB), then the tracker 100 assumes a locked position 1001. Alternatively, if it is determined at 1070 that the tracker 100 is in the west invalid region (WIR) or is in the west out of bounds region (WOB), then at 1060, the east bellows 300E of the tracker 100 will vent and the west bellows 300W will fill.

However, where the tracker 100 is moving east 1056 and it is alternatively determined at 1072 that the bellows with most pressure (BMP) has a pressure that is less than the max pressure high (MPH), then the west bellows 300W of tracker 100 fill at 1074. Where the west bellows 300W of the tracker 100 are filling at 1074 and it is determined at 1076 that the tracker 100 is in the east invalid region (EIR) or is in the east out of bounds region (EOB), then the tracker 100 assumes a locked position 1001. Alternatively, if it is determined at 1078 that the tracker 100 is in the west invalid region (WIR) or is in the west out of bounds region (WOB), then at 1060, the east bellows 300E of the tracker 100 will vent and the west bellows 300W will fill.

For the east filling at 1024 and 1010 and for the west filling at 1074 and 1060, the fill routine can have various duty cycles (e.g., 80% on and 20% off), with a total period that can be based on the number of actuators 101 in a tracker 100. In various embodiments, a pressure measurement can be taken at the end of each off period, and if it is determined that a bellows 300 is over pressure (e.g., greater than max pressure high (MPH)), then the off period can be maintained and pressure measurements can be maintained until no bellows 300 is over pressure.

As discussed herein, in various embodiments a tracking window 1100 can be used to control one or more actuators 101 of a solar tracker 100. Referring to the tracking window 1100, in another embodiment, if the tracker 100 is in a valid region (e.g., east or west valid regions (EVR) (WVR)) and the tracker 100 is in a locked position, then valves associated with the bellows 300 of the actuators 101 of the tracker 100 can be in a closed configuration. However, if the tracker 100 enters a semi-valid region (e.g., east or west semi-valid regions (ESVR) (WSVR)), and the position of the tracker 100 is locked, then the tracker position can be unlocked, which can include opening one or more valves associated with the bellows 300 of the actuators 101 of the tracker 100. For example, at least one valve can open to introduce or remove fluid from one or more bellows 300 to drive the tracker 100 toward the sun.

However, in some embodiments, where the tracker 100 is determined to be in an out of bounds region (e.g., east or west out of bounds (EOB)(WOB)), then two or more valves can be opened to drive the tracker 100 towards the sun. For example, where the tracker 100 crosses into an out-of-bounds region from an invalid region, then a determination can be made as to what valve is already on and one or more additional valves can be enabled based on the identity of the first enabled valve.

Additionally, where the tracker 100 is driving towards the sun, then the enabled valves can be disengaged or disabled when the tracker 100 reaches an opposite tracking window boundary, which can include the current angle of the sun boundary 1103, the boundary between a valid and semi-valid region, or the like.

For introducing fluid to bellows 300, in various embodiments, fluid will only be added to the bellows of maximum pressure (BMP) if such bellows 300 has a pressure that is below the bellows max pressure high (MPH) and the identified pressure of the BMP is considered valid. In various embodiments, it can be desirable to not increase the pressure of the BMP more than the MPH, which in various embodiments can be defined as half of a maximum PSI window.

In various embodiments, movement of actuators 101 by removing or releasing fluid from bellows 300 can be the implemented method of actuation unless the pressure identified for the relevant pneumatic circuit is valid and the BMP has a pressure that is less than the max pressure low (MPL), which can be defined as half of a maximum PSI window. Additionally or alternatively, movement of actuators 101 by removing or releasing fluid from bellows 300 can be the implemented method of actuation unless the pressure identified for the relevant pneumatic circuit is valid and the tracker 100 is determined to be in an out-of-bounds region (e.g., east or west out of bounds (EOB) (WOB)).

Figure 12:
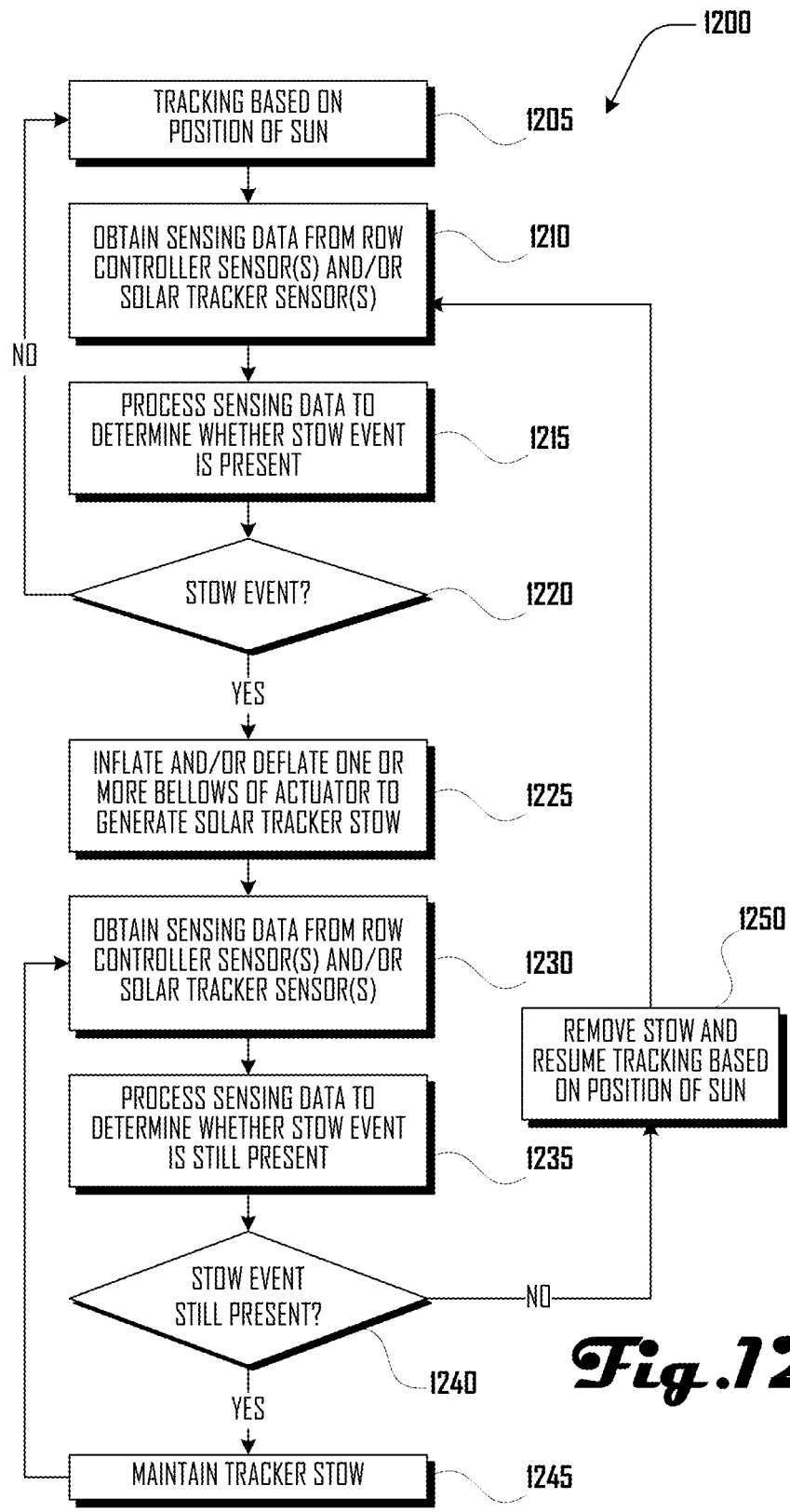
FIG. 12 illustrates a method of identifying a stow event and generating a stow in one or more tracker.

Turning to FIG. 12, a method 1200 of identifying a stow event and generating a stow in one or more tracker 100 is illustrated. The method 1200 begins at 1205, where one or more trackers 100 are tracking the position of the sun (e.g., as shown in FIG. 7, 8a, 8b or 9) and at 1210, sensing data from one or more row controller sensors and/or one or more solar tracker sensors. At 1215, the received sensing data is processed to determine whether a stow event is present, and at 1220 a determination is made whether a stow event is present.

For example, in some embodiments, data regarding wind speed or velocity can be obtained from wind sensors 655 at a row controller and/or wind sensors 607A, 607B of one or more solar trackers 100A, 100B. Such wind data can be evaluated to determine whether it indicates wind conditions that pose a threat to one or more trackers 100. In other words, where the solar trackers 100 comprise large planar photovoltaic panels 103, wind force can have a strong and undesirable impact on the panels 103, which can potentially cause damage to the photovoltaic panels 103. Accordingly, where wind data identifies wind conditions above a certain threshold and for a certain time period, it can be determined that a stow event is present (i.e., an event that warrants stow of one or more trackers 100).

Additionally or alternatively, wind data can indicate that actuator stiffness should be increased to make the actuators 101 of one or more trackers more rigid to oppose wind force. For example, as discussed herein, opposing bellows 300E, 300W of an actuator can be at equilibrium or generate movement at various opposing pressures, with equilibrium at greater pressures generating more rigidity in the bellows 300E, 300W and therefore more rigidity in the actuators 101. However, maintaining the lowest operating pressures possible can be desirable to reduce wear on the bellows 300 and actuators 101 and also to reduce fluid and power consumption. Accordingly, it can be desirable to have actuators 101 operate at a minimum operating pressure when no wind is present and to dynamically increase pressure, stiffness or rigidity of the actuators 101 in response to increasing wind velocity or speed. However, at a certain threshold, it can be desirable to put the trackers 100 into a stow configuration to protect the trackers 100 from damage.

Additionally, in various embodiments, the bellows 300 and pressures experienced by the bellows 300 can be used to identify whether wind is present and whether the wind conditions are such that the tracker 100 should be put into a stow configuration for protection against the wind or whether increasing the pressure of the bellows 300 to prevent wobble would be desirable. For example, where a pressure sensor associated with a bellows 300 senses a series of pressure spikes and dips, this can be an indication of wind affecting the position of the photovoltaic cells 103 of the tracker 100. If such a sensed condition reaches one or more thresholds (e.g., a maximum or minimum pressure outside of a median pressure; number of pressure spikes and/or dips of a certain magnitude, and the like), then the tracker 100 can be put into a stow configuration or the pressure of the bellows 300 can be increased to combat wobble. Although such sensing can be performed by wind and/or pressure sensors, in further examples such sensing can be performed by one or more of inclinometers, changes in power output of photovoltaic cells, or any combination of pressure sensors, inclinometers, photovoltaic power output, and the like.

In various embodiments, it can be desirable for actuators 101 to be configured to stow on power loss. In other words, where the pneumatics system loses power, one or more actuators 101 of the system 400 will default to a desired safe stow position. For example, using a cross-over valve, the valve can "normally open" with a spring-return. It is held closed when the system is powered. When power is lost the cross-over valve opens. This can create a "stow on power loss" function for the system. In some examples, a cross-over valve can connect the east and west control air tubes. Air from higher pressure bellows can flow to lower pressure bellows. The cross-over valve can reduce total system air use by up to 50%, in various embodiments.

Accordingly, a stow event can be present based upon various detected failures in a solar tracking system 400, including power loss, failure of pneumatic elements (e.g., bellows 300, pneumatic lines 390, a pneumatic circuit 382, fluid source 652, valves, or the like), failure of one or more sensors (e.g., pressure sensors 653, 601, temperature sensors 654, 605, wind sensors 655, 607, sun sensors 656, clock 657, inclinometer 603, and the like), or failure of control systems (e.g., the control device 651, pneumatic control unit 384, and the like). In various embodiments, control systems can execute a stow event or a stow event can occur automatically upon such a failure. For example, power or pressure loss can automatically result in fluid valves causing a stow of the trackers 100 as described herein.

Returning to the method 1200 of FIG. 12, if at 1220 it is determined that a stow event is not present, then the method 1200 cycles back to 1205 where tracking based on the position of the sun continues. However, if at 1220 it is determined that a stow event is present, at 1225 the bellows 300 of one or more trackers 100 are inflated and/or deflated to generate a stowed configuration for the one or more trackers 100.

In various embodiments, a stow configuration of a tracker 100 can include various suitable configurations. For example, in some embodiments, a stow position for an actuator can be a flat or neutral position N, or maximum tilt positions A, B (see FIG. 2). In some embodiments, a stow at maximum tilt positions A, B can include pressurizing the tracker against a stop to rigidly fix the tracker 100 at one of the maximum tilt positions A, B. In other words, a bellows 300 opposing the stop can be inflated to force the actuator 101 or other portion of the tracker 100 against the stop. The non-opposing bellows 300 can be fully deflated in some embodiments to allow for the opposing bellows 300 to provide maximum force against the stop.

In further embodiments, the bellows 300 of one or more actuators 101 can be inflated to an equilibrium to rigidly fix the bellows 300 in a desired configuration. For example, in some embodiments, inflation of both bellows 300E, 300W of an actuator to a maximum fill pressure can generate a flat stow or a stow in the neutral configuration N (see FIG. 2).

Returning to the method 1200 of FIG. 12, at 1230 sensing data is obtained from one or more row controller sensors and/or one or more solar tracker sensors, and at 1235, the sensing data is processed to determine whether a stow event is still present. If at 1240 a determination is made that a stow event is still present, then at 1245, tracker stow is maintained and the method 1200 cycles back to 1230 where further sensing data is received and the state of the solar tracking system 400 is monitored. However, if at 1240 a determination is made that a stow event is not still present, then at 1250, stow is removed and tracking based on position of the sun is resumed. The method 1200 then cycles back to 1210 where monitoring for a further stow event occurs.

Figure 13:
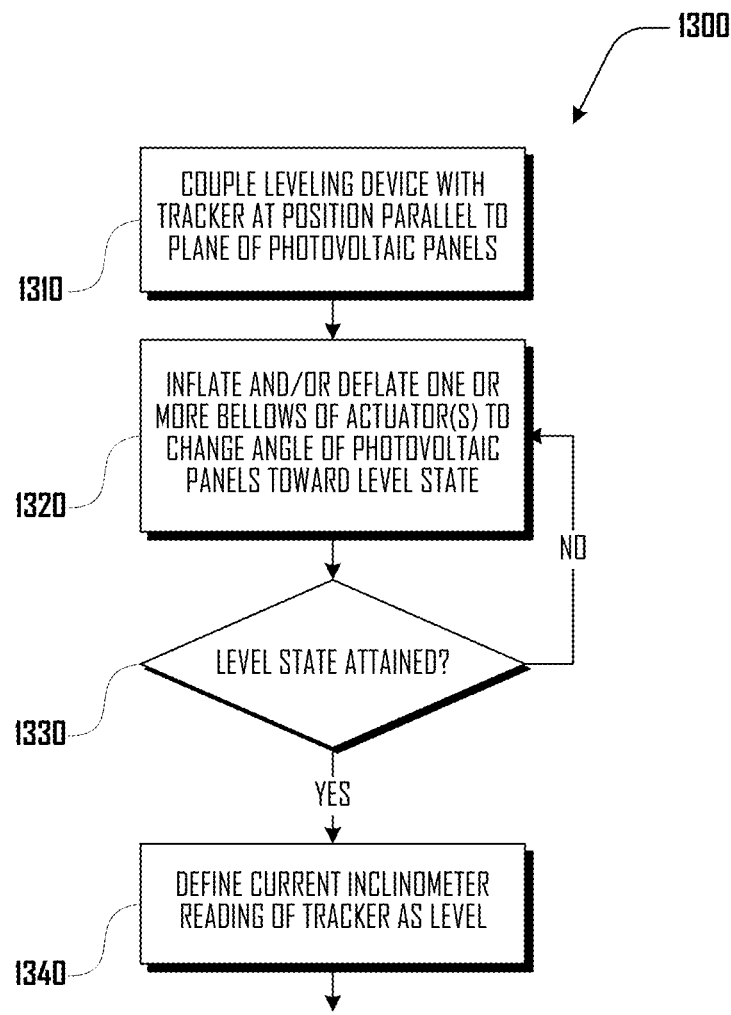
FIG. 13 illustrates a method 1300 of level-calibrating a solar tracker in accordance with an embodiment.

FIG. 13 illustrates a method 1300 of level-calibrating a solar tracker 100 in accordance with an embodiment. For example, when a solar tracker 100 is at the factory or set in place via posts 104 (See FIGS. 1*a*, 1*b* and 2) or other suitable structures, it can be desirable to calibrate or "zero" the system by determining an output of inclinometers 603 (See FIG. 6) of one or more trackers 100 that should be defined as where the tracker 100 is level. The method begins at 1310 where a leveling device is coupled with the tracker 100 at a position that is parallel to the plane of the photovoltaic panels 103. For example, in some embodiments, a leveling device can be coupled to a top plate 330 of an actuator 101 or other suitable structure that is parallel to the plane of the photovoltaic panels 103.

Additionally, a leveling device can comprise any suitable device that can sense and/or present a level status, including a bubble level, a digital level, plumb bob, or the like. In some embodiments, a body of a leveling device can comprise opposing faces disposed at a right angle (e.g. an angle bracket), which can be desirable for coupling to squared portions of an actuator 101, tracker 100, or the like. In further embodiments, the leveling device can comprise a magnet, which can be desirable for coupling to metal portions of an actuator 101, tracker 100, or the like.

Returning to the method 1300, at 1320 one or more bellows 300 of one or more actuators 101 are inflated and/or deflated to move the photovoltaic cells 103 toward a level position, and if it is determined at 1330 that a level state has not yet been attained the one or more bellows 300 of one or more actuators 101 are further inflated and/or deflated to further move the photovoltaic cells 103 toward a level position. However, where it is determined at 1330 that a level status has been obtained, then the current inclinometer reading is defined or set as being level for the photovoltaic cells 103 of the tracker 100.

For example, setting a current inclinometer reading as being level for the photovoltaic cells 103 of the tracker 100 can include a manual input to a device at a row controller 380. Additionally, in some embodiments, a wired or wireless connection with a row controller 380 can communicate a level status or otherwise facilitate calibration of the level status of a tracker 100.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

What is claimed is:

1. A pneumatic solar tracker system comprising:
   a plurality of solar trackers, with each solar tracker including:
      a plurality of photovoltaic cells disposed in a common plane and extending along a first length having a first axis, the plurality of photovoltaic cells coupled to rails that extend along a second axis that is parallel to the first axis;
      a plurality of pneumatic actuators coupled to the rails and configured to collectively rotate the plurality of photovoltaic cells, the plurality of pneumatic actuators disposed along a common third axis that is parallel to the first and second axis, each of the plurality of pneumatic actuators having:
         a bottom plate;
         a top-plate coupled to the rails; and
         a first and second bellows extending between and coupled to the top plate and bottom plate; and
   a row controller operably coupled to and configured to control the plurality of solar trackers, the row controller comprising:
      a shared pneumatic fluid source;
      a pneumatic circuit having one or more pneumatic lines coupled of a first set of bellows including the first bellows of the plurality of pneumatic actuators and one or more pneumatic lines coupled of a second set of bellows including the second bellows of the plurality of pneumatic actuators, the first and sets of bellows being mutually exclusive; and
      an active electronic pneumatic control unit configured to collectively inflate the first set of bellows with fluid from the shared pneumatic fluid source via the pneumatic circuit and configured to separately inflate the second set of bellows with fluid from the shared pneumatic fluid source via the pneumatic circuit, the active electronic pneumatic control unit configured for:
         determining a current position of the sun;
         determining a target ideal angle of the plurality of photovoltaic cells to match the determined current position of the sun;
         determining a current angle of the plurality of photovoltaic cells;
         determining a difference between the determined current angle of the plurality of photovoltaic cells and the determined target ideal angle of the plurality of photovoltaic cells;
         determining that the determined difference between the determined current angle of the plurality of photovoltaic cells and the determined target ideal angle of the plurality of photovoltaic cells is outside of a tolerance range; and
         based at least in part on the determining that the determined difference between the determined current angle of the plurality of photovoltaic cells and the determined target ideal angle of the plurality of photovoltaic cells is outside of a tolerance range, actuating the plurality of photovoltaic cells toward the determined target ideal angle by at least one of inflating the first or second set of bellows with fluid from the shared pneumatic fluid source via the pneumatic circuit.

2. The pneumatic solar tracker system of claim 1, wherein the current position of the sun is determined by the active electronic pneumatic control unit based on a determined time and based on an astrological sun chart that indicates sun position based on time and location of the pneumatic solar tracker system.

3. The pneumatic solar tracker system of claim 1, wherein the target ideal angle of the plurality of photovoltaic cells corresponds to an angle that maximizes electrical output of the plurality of photovoltaic cells of the solar trackers.

4. The pneumatic solar tracker system of claim 1, wherein the electronic pneumatic control unit further determines that a stow event is present based on sensor data obtained from sensors of the row controller, and based at least in part on determining that the stow event is present, actuating the plurality of photovoltaic cells to a stow position by at least one of inflating the first or second set of bellows with fluid from the pneumatic fluid source via the pneumatic circuit.

5. A pneumatic solar tracker system comprising:
a plurality of solar trackers, with each solar tracker including one or more photovoltaic cells and a plurality of pneumatic actuators coupled to the one or more photovoltaic cells, each of the plurality of pneumatic actuators having a first and second bellows; and
a row controller operably coupled to and configured to control the plurality of solar trackers, the row controller comprising:
a pneumatic circuit having one or more pneumatic lines coupled of a first set of bellows including the first bellows of the plurality of pneumatic actuators and one or more pneumatic lines coupled of a second set of bellows including the second bellows of the plurality of pneumatic actuators, the first and sets of bellows being mutually exclusive; and
an electronic pneumatic control unit configured to collectively inflate the first set of bellows with fluid from a pneumatic fluid source via the pneumatic circuit and configured to separately inflate the second set of bellows with fluid from the pneumatic fluid source via the pneumatic circuit, the electronic pneumatic control unit:
determining a current position of the sun;
determining an angle of the one or more photovoltaic cells to correspond the determined current position of the sun;
determining a current angle of the one or more photovoltaic cells;
determining a difference between the determined current angle of the one or more photovoltaic cells and the determined angle of the one or more photovoltaic cells to correspond the determined current position of the sun;
determining that the determined difference between the determined current angle of the one or more photovoltaic cells and the determined angle of the one or more photovoltaic cells to correspond the determined current position of the sun is outside of a tolerance range; and
based at least in part on the determining that the determined difference between the determined current angle of the one or more photovoltaic cells and the determined angle of the one or more photovoltaic cells to correspond the determined current position of the sun is outside of a tolerance range, actuating the one or more photovoltaic cells toward the determined angle of the one or more photovoltaic cells to correspond the determined current position of the sun by at least one of inflating the first or second set of bellows with fluid from the pneumatic fluid source via the pneumatic circuit.

6. The pneumatic solar tracker system of claim 5, wherein the current position of the sun is determined by the electronic pneumatic control unit based on a determined time and based on an astrological sun chart that indicates sun position based on time and location of the pneumatic solar tracker system.

7. The pneumatic solar tracker system of claim 5, wherein the angle of the one or more photovoltaic cells to correspond the determined current position of the sun corresponds to an angle that maximizes electrical output of the one or more photovoltaic cells of the solar trackers.

8. The pneumatic solar tracker system of claim 5, wherein the electronic pneumatic control unit further determines that a stow event is present based on sensor data obtained from sensors of the row controller and based at least in part on determining that a stow event is present, actuating the one or more photovoltaic cells to a stow position by at least one of inflating the first or second set of bellows with fluid from the pneumatic fluid source via the pneumatic circuit.

9. A pneumatic solar tracker system comprising an electronic pneumatic control unit configured to inflate a first set of bellows with fluid from a pneumatic fluid source via a pneumatic circuit and configured to separately inflate the second set of bellows with fluid from the pneumatic fluid source via a pneumatic circuit, the first and second set of bellows associated with one or more pneumatic actuators, the electronic pneumatic control unit:
determining a target configuration of the one or more pneumatic actuators based on a determined current position of the sun;
determining a current configuration of the one or more pneumatic actuators;
determining a difference between the determined current configuration of the one or more pneumatic actuators and the determined target configuration of the one or more pneumatic actuators;
determining that the determined difference between the determined current configuration of the one or more pneumatic actuators and the determined target configuration of the one or more pneumatic actuators is outside of a tolerance range; and
based at least in part on the determining that the determined difference between the determined current configuration of the one or more pneumatic actuators and the determined target configuration of the one or more pneumatic actuators is outside of a tolerance range, actuating the one or more pneumatic actuators toward the determined target configuration by at least one of inflating the first or second set of bellows with fluid from the pneumatic fluid source via the pneumatic circuit.

10. The pneumatic solar tracker system of claim 9, wherein the current position of the sun is determined based on a time determined by the electronic pneumatic control unit and based on an astrological sun chart that indicates sun position based on time and location of a pneumatic solar tracker system that includes the electronic pneumatic control unit.

11. The pneumatic solar tracker system of claim 10, wherein the electronic pneumatic control unit further comprises a clock, and wherein the time is determined based on time data from the clock.

12. The pneumatic solar tracker system of claim 9, wherein the target configuration of the one or more pneumatic actuators corresponds to an angle that maximizes electrical output of photovoltaic cells coupled to the one or more pneumatic actuators.

13. The pneumatic solar tracker system of claim 9, wherein the electronic pneumatic control unit further determines that a stow event is present, and based at least in part on the determining that a stow event is present, actuating the one or more pneumatic actuators to a stow position by at least one of inflating the first or second set of bellows with fluid from the pneumatic fluid source via the pneumatic circuit.

14. The pneumatic solar tracker system of claim 13, wherein determining that a stow event is present includes at least one of:
    determining that wind speed or velocity near a pneumatic solar tracker system that includes the electronic pneumatic control unit is above a threshold; or
    identifying a power outage at a pneumatic solar tracker system that includes the electronic pneumatic control unit.

15. The pneumatic solar tracker system of claim 9, wherein the first set of bellows comprises a plurality of bellows and wherein the second set of bellows comprises a plurality of bellows.

16. The pneumatic solar tracker system of claim 9, wherein the first set of bellows consists of respective single bellows on a first side of a plurality pneumatic actuators, and wherein the second set of bellows consists of respective single bellows on a second side of the plurality of pneumatic actuators.

17. The pneumatic solar tracker system of claim 9, wherein the determining the current configuration of the one or more pneumatic actuators is based at least in part on data obtained by the electronic pneumatic control unit from an inclinometer associated with the one or more pneumatic actuators.

18. The pneumatic solar tracker system of claim 9, wherein the determining the current configuration of the one or more pneumatic actuators is based at least in part on data obtained by the electronic pneumatic control unit from one or more pressure sensor associated with the one or more pneumatic actuators.

19. The pneumatic solar tracker system of claim 9, wherein the one or more pneumatic actuators includes a plurality of pneumatic actuators, the plurality of pneumatic actuators including a first plurality set of pneumatic actuators associated with a first solar tracker, and a second plurality set of pneumatic actuators associated with a second solar tracker separate from the first solar tracker.

20. The pneumatic solar tracker system of claim 1, wherein the current position of the sun is determined based on a determined time and based on an astrological sun chart that indicates sun position based on time and location of the pneumatic solar tracker system;
    wherein the electronic pneumatic control unit further determines that a stow event is present based on sensor data obtained from sensors of the row controller, and based at least in part on determining that the stow event is present, actuating the plurality of photovoltaic cells to a stow position by at least one of inflating the first or second set of bellows with fluid from the pneumatic fluid source via the pneumatic circuit; and
    wherein the determining the current configuration of the one or more pneumatic actuators is based at least in part on data obtained by the electronic pneumatic control unit from one or more pressure sensor associated with the one or more pneumatic actuators.

* * * * *